United States Patent
Shen

(10) Patent No.: US 10,685,851 B2
(45) Date of Patent: Jun. 16, 2020

(54) HYBRID-CLOTH-BASED METHOD FOR MAKING TSV SUBSTRATES

(71) Applicant: Yuci Shen, Cupertino, CA (US)

(72) Inventor: Yuci Shen, Cupertino, CA (US)

( * ) Notice: Subject to any disclaimer, the term of this patent is extended or adjusted under 35 U.S.C. 154(b) by 223 days.

(21) Appl. No.: 15/881,726

(22) Filed: Jan. 27, 2018

(65) Prior Publication Data

US 2019/0237342 A1   Aug. 1, 2019

(51) Int. Cl.
*H01L 21/48* (2006.01)
*H01L 23/498* (2006.01)

(52) U.S. Cl.
CPC ........ *H01L 21/486* (2013.01); *H01L 21/4853* (2013.01); *H01L 21/4857* (2013.01); *H01L 23/4985* (2013.01); *H01L 23/49811* (2013.01); *H01L 23/49822* (2013.01); *H01L 23/49827* (2013.01); *H01L 23/49866* (2013.01); *H01L 2224/05198* (2013.01)

(58) Field of Classification Search
CPC ............. H01L 21/4842; H01L 21/4853; H01L 21/4857; H01L 21/486; H01L 23/49811; H01L 23/49822; H01L 23/49827; H01L 23/49866; H01L 23/49894; H01L 23/5226; H01L 2224/05009; H01L 2224/05198; H01L 2224/05199; H01L 2224/06541; H01L 2224/06544; H01L 2224/29198; H01L 2224/29199; H01L 2224/29398; Y10T 29/49162; H05K 2201/0275; H05K 2201/0278; H05K 2201/0281; H05K 2201/0287; H05K 2201/029; H05K 2201/0293

See application file for complete search history.

(56) References Cited

U.S. PATENT DOCUMENTS

| | | | | |
|---|---|---|---|---|
| 6,599,561 | B2 * | 7/2003 | Dow | D03D 1/0082 29/825 |
| 7,191,803 | B2 * | 3/2007 | Orr | A61B 5/0002 139/408 |
| 8,161,636 | B2 * | 4/2012 | Yokouchi | H05K 1/0366 29/830 |
| 8,217,271 | B2 * | 7/2012 | Okazaki | H05K 3/4688 174/250 |
| 9,397,035 | B2 * | 7/2016 | Shen | H01L 23/49827 |
| 9,521,751 | B2 * | 12/2016 | Roy | H05K 1/165 |
| 2004/0012937 | A1 * | 1/2004 | DeGrappo | H05K 1/16 361/782 |
| 2019/0373725 | A1 * | 12/2019 | Kaizu | D03D 1/0082 |

\* cited by examiner

*Primary Examiner* — Peter Dungba Vo
*Assistant Examiner* — Joshua D Anderson

(57) ABSTRACT

The disclosure describes a method for making a hybrid cloth integrated column and further making TSV substrates, which comprises the key processing steps: forming a hybrid cloth by using metal wires and supportive wires, which contains at least one 2D array of parallel metal wires in one direction; forming a column of layered structure, which contains at least a plurality of layers of hybrid cloths, wherein all the 2D arrays of parallel metal wires are fixed in the column of layered structure and are arranged into a 3D array of parallel metal wires; making all the layers of the column of layered structure into a solid entity so as to form a hybrid cloth integrated column; and slicing the hybrid cloth integrated column to make TSV substrates.

18 Claims, 18 Drawing Sheets

| forming a hybrid cloth by weaving metal wires and supportive wires, wherein at least a 2D array of parallel metal wires is arranged in one direction of the hybrid cloth | S1 |

⇩

| forming a column of layered structure by integrating a plurality of layers of supportive plates and a plurality layers of hybrid cloths, wherein any two neighboring layers of hybrid cloths are separated by at least one layer of supportive plate, and the plurality of 2D arrays of parallel metal wires contained in the plurality of hybrid cloths are fixed in the column of layered structure and arranged into a 3D array of parallel metal wires | S2 |

⇩

| making all the layers in the column of layered structure into a solid entity so as to form a hybrid cloth integrated column | S3 |

⇩

| sawing the hybrid cloth integrated column along the direction normal to the direction of the 3D array of parallel metal wires into slices so as to produce a plurality of TSV substrates | S4 |

FIG. 7

HYBRID-CLOTH-BASED METHOD FOR MAKING TSV SUBSTRATES

TECHNICAL FIELD OF THE DISCLOSURE

The disclosure relates generally to integrated circuit semiconductor packaging technology, and particularly to a method for making a hybrid cloth integrated column and further making substrates with through substrate via (TSV), which are used in packaging semiconductor chips or electric devices.

BACKGROUND OF THE DISCLOSURE

Substrates containing through substrate via (TSV), called TSV substrate herein, have been extensively used for packaging semiconductor chips or electric devices, which are the bridge connecting two or more electric devices with a fine pitch of electric contacts to a substrate or board with a coarse pitch of electric contacts in 3D and 2.5D semiconductor chip package. TSV substrates include silicon, glass, ceramic and organic TSV substrates. The methods of prior arts for making TSV substrates are generally fall into two categories: one is a substrate-based method (named herein), and the other is a via-based method (named herein). The substrate-based method basically comprises: 1) opening a patterned array of vias on a substrate (a piece of silicon, organic substrate or glass), and 2) using a conductive material to fill in the patterned array of vias. And the via-based method basically comprises: 1) forming a patterned array of vias on a carrier, 2) using a substrate material to cover and seal the patterned array of via, then polishing away the excessive substrate material above the patterned array of vias. An IC chip packaging substrate can be further produced by forming one or more layers of electric traces and pads on the upper and lower surfaces of the TSV substrate.

The substrate-based or via-based method of prior arts is called a micro method herein, wherein each via and its position are designed and made by using micro-level processing technologies. It is noted that the micro method for making TSV substrates has some limitations in its manufacture and application, including: 1) its manufacture is very time consuming and expensive, 2) the diameter of the via cannot be very small, for example, it is very difficult to make a via with diameter less than 10 um in a substrate thicker than 200 um, 3) the via pitch cannot be very small, for example, it is very difficult and expensive to make a via pitch less than 50 um in a substrate thicker than 200 um, 4) the thickness of TSV substrate is limited by the via diameter and pitch, wherein the smaller the via diameter and pitch is, the thinner the substrate has to be, 5) the very thin TSV substrates, usually being about 100 um in thickness, are easily broken in its further manufacture and application.

There are other types of methods of prior arts, called macro methods herein for making TSV substrates, wherein the TSV is not made through micro-level technologies such as etching or drilling each hole, but made from metal wires through macro-level technologies. As shown by the numerical symbol 40 in FIG. 1, the common part of the types of macro methods is to make a column of matrix containing a 3D array of parallel metal wires along the column direction, as shown by the numerical symbol 41, then saw the column of matrix into slices so as to produce TSV substrates, as shown by the numerical symbol 42; and the feature of each type of macro method is its way to make a column of matrix containing a 3D array of parallel metal wires. There are three types of macro methods of prior arts, as designated by the numerical symbol 10, 20 and 30 in FIG. 2. In the first method designated by the numerical symbol 10 in FIG. 2, a column of matrix containing a 3D array of parallel metal wires is made by rolling a coated metal wire 11 around a multiple side of column, then joining the coatings 12 together by using a designed temperature and pressure so as to form the column of matrix containing a 3D array of parallel metal wires on each side of the multiple side of column. In the second method designated by the numerical symbol 20 in FIG. 2, a column of matrix containing a 3D array of parallel metal wires is made by forming a matrix piece 22 with a plurality of parallel metal wires 21 first, then stacking a plurality of layers of such matrix pieces into a column of layered structure, and then joining the layers together into a solid entity by using a designed temperature and pressure so as to form a column of matrix containing a 3D array of parallel metal wires. Finally, in the third method designated by the numerical symbol 30 in FIG. 2, a column of matrix containing a 3D array of parallel metal wires is made by forming and fixing a 3D array of metal wires 31 in a framework as designated by the numerical symbols 33 and 34 first, then filling a filling material 32 into the empty space in and around the 3D array of metal wires 31, and then solidifying the filling material so as to form the column of matrix containing a 3D array of parallel metal wires.

In comparison with a micro method for making TSV substrates, the advantages of a macro method based on metal wires for making TSV substrates include: 1) TSV substrates can be produced cost-efficiently in batches, 2) the via diameter and pitch can be very small, 3) the thickness of the TSV substrates is not limited by the via diameter and pitch. It is noted that all the three types of macro methods are technologically feasible for making a plastic material of column containing a 3D array of parallel metal wires. Comparing the three macro methods as shown in FIG. 2, the first method is simplest, the third method can make a more complicated pattern of 3D array of parallel metal wires, and the second method is between them. However, when making a ceramic material of column of matrix containing a 3D array of parallel metal wires or ceramic TSV substrates, all the three types of macro methods technically have drawbacks. For the first two macro methods, aside from the high cost for making ceramic coating on a metal wire or thin ceramic pieces with metal wires, their drawback is that there are too many interfaces among ceramic coatings or ceramic matrix pieces. As a result, when joining the ceramic coatings or ceramic pieces together by using a temperature and pressure, it is difficult to ensure a good adhesion without voids among the coatings or without cracking or delaminating issue among the ceramic matrix pieces. As for the third type of macro method, because a filling material such as a paste type or powder type of ceramic material is used, it doesn't have the drawback due to the interfaces among ceramic coatings or ceramic matrix pieces as in the first and second types of macro methods. However, it has another drawback, that is, it is difficult to ensure that some of the thin and long metal wires are not moved away from their original positions or are not broken when filling a paste type or powder type of ceramic material among the metal wires because the metal wires are only fixed at their two ends by the framework. Summarily, in the first and second types of macro methods, the metal wires are well fixed, but the matrix material are the coatings or matrix pieces, causing the drawback that there are too many interfaces among coatings or matrix pieces, while in the third type of macro method, even though a filling material is preferably used, the metal wires are only fixed at their ends by the framework, causing the drawback that the metal wires are not well fixed and as a result, they can be moved or broken when applying the filling material.

SUMMARY OF THE DISCLOSURE

In order to overcome the drawbacks of the macro methods for making ceramic TSV substrates of prior arts, a new method for making a new hybrid cloth integrated column and further making TSV substrates is disclosed in the present invention. The hybrid cloth is the featured element of the present invention, which is formed and used in the present method. As a result, the metal wires are efficiently and reliably fixed and arranged by the hybrid cloth and a paste or powder type of ceramic material can also be used to make a column with one 3D array of parallel metal wires in one embodiment of the present invention. A summary of the disclosure is as follows.

According to one embodiment of the present invention, a method for making a hybrid cloth integrated column and further making TSV substrates, comprising: 1) forming a hybrid cloth by weaving metal wires and supportive wires, wherein at least one 2D array of parallel metal wires is arranged in one direction of the hybrid cloth; 2) forming a column of layered structure by integrating a plurality of layers of supportive plates and a plurality of layers of hybrid cloths, wherein any two neighboring layers of hybrid cloths are separated by at least one layer of supportive plate, and the plurality of 2D arrays of parallel metal wires contained in the plurality of hybrid cloths are fixed in the column of layered structure and arranged into at least one 3D array of parallel metal wires; 3) making all the layers in the column of layered structure into a solid entity so as to form a hybrid cloth integrated column; and 4) sawing the hybrid cloth integrated column along the direction normal to the direction of the 3D array of parallel metal wires into slices so as to produce a plurality of TSV substrates.

According to another embodiment of the present invention, a method for making a hybrid cloth integrated column and further making TSV substrates, comprising: 1) forming a hybrid cloth by weaving metal wires and supportive wires, wherein at least one 2D array of parallel metal wires is arranged in one direction of the hybrid cloth; 2) forming a column of layered structure by integrating and fixing a plurality of layers of hybrid cloths in a framework, wherein the plurality of 2D arrays of parallel metal wires contained in the plurality of hybrid cloths are fixed in the framework and arranged into one 3D array of parallel metal wires; 3) filling a filling material into the empty space in and around the column of layered structure, solidifying the filling material so that the column of layered structure is sealed in the filling material, forming a hybrid cloth integrated column; and 4) sawing the hybrid cloth integrated column along the direction normal to the direction of the 3D array of parallel metal wires into slices so as to produce a plurality of TSV substrates.

According to one preferred embodiment of the present invention, said methods above further comprise the processing steps for making substrates containing an array of redistributed TSV based on TSV substrates.

Other embodiments of the present invention are also disclosed.

It is noted that the new method for making TSV substrates in the disclosure of the present invention is a new macro method based on metal wires, which has the advantages of a macro method as compared to a micro method. Furthermore, it has the advantages as compared to the macro methods of prior arts, that is, 1) TSV ceramic or glass substrates can be efficiently produced in batches, and 2) there are more parameters in the new method of the present invention for designing TSV substrates so that some new TSV substrates can be produced. It is further noted that the method of the present invention has a featured element, that is, the hybrid cloth containing metal wires and supportive wires so that in addition to the advantage that the metal wires are well fixed and a filling material can be used in the meantime in one embodiment of the present invention, one or more embodiments of the present invention have more design parameters for designing and producing various TSV substrates to meet various requirements from packaging semiconductor chips. For example, there are only two material parameters, i.e., the matrix material and metal wires in the macro methods of prior arts, but in the method of the present invention, besides the two material parameters, there are many other parameters, for example, the parameters from the hybrid cloth, including supportive wires and a network of metal wires, and many other parameters from the supportive plate, including its geometrical structure and material.

More features, advantages and inventive concepts of the present invention are described with reference to the detailed description of the embodiments of the present invention.

BRIEF DESCRIPTION OF THE DRAWINGS

FIG. 7 is a flow-process diagram of the method for making TSV substrates of one embodiment of the present invention.

DETAILED DESCRIPTION OF THE PREFERRED EMBODIMENT

Figure 1:
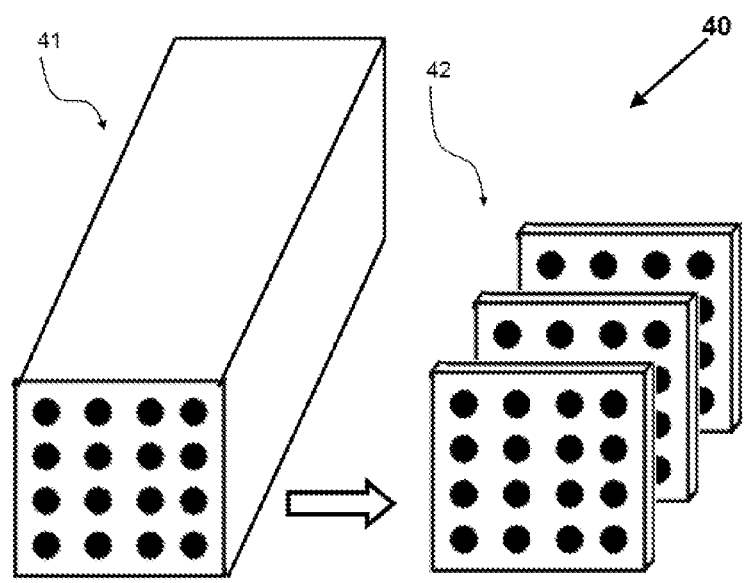
FIG. 1 is a schematic diagram illustrating the common part, which the macro methods have for making TSV substrates of prior arts.

In order to clearly describe the embodiments of the present invention with reference to the drawings, some terminologies are first explained in the following: 1) a supportive wire, which is a nonconductive wire, such as fiberglass wire, carbon fiber wire or polymer wire, and is called a supportive wire herein because its major function is to arrange and fix metal wires in the present invention; 2) a supportive plate, which is a plate, and is called a supportive plate herein because one of its major functions is to arrange and fix metal wires in the present invention; 3) a supportive cloth, which means a cloth woven from supportive wires; 4) a supportive mesh cloth, which means a cloth loosely woven from supportive wires, in which holes among wires are much bigger than the wire diameter; 5) a hybrid cloth, which means a cloth woven from metal wires and supportive wires in a hybrid way; 6) a hybrid mesh cloth, which means a cloth loosely woven from metal wires and supportive wires in a hybrid way, in which holes among wires are much bigger than the wire diameter; 7) a 2D array of parallel metal wires, which means a group of metal wires distributed in a plane or a layer of material, being parallel among each other and having a determined wire pitch, and which will be further explained with reference to the drawings; 8) a 3D array of parallel metal wires, which generally means a group of metal wires distributed in a volume or a column of material, being parallel among each other and having a determined wire pitch, which further means a group of metal wires consisting of a plurality of 2D arrays of parallel metal wires herein, and which will be further explained with reference to the drawings; 9) a through substrate via (TSV), which means an electrically conductive path embedded in a substrate and goes through the substrate from its thickness direction, such as a metal pillar; 10) a redistributed TSV, which means an electrically conductive path from one metal pad on the upper surface of a substrate to the other metal pad on the lower surface of the substrate, wherein the pair of metal pads are electrically connected by at least one TSV; 11) a column of layered structure, which means a structure consisting of a plurality of layers of materials and being a column shape from outline; a column of layered structure, 12) a substrate, which means a piece of material, such as a piece of ceramic, glass, silicon or polymer material, having two major surfaces, called upper surface and lower surface, where the upper surface is opposite to the lower surface from the thickness direction of the substrate; 13) a matrix, which means the material or materials in a composite structure for mechanically fixing and embedding other elements; 14) a filling material, which means a type of material such as a liquid, ink, paste and powder type of material, and can be used for filling in the empty space such as holes or gaps in a structure, and which, after being solidified, can be the matrix or a portion of the matrix of a composite structure. It is noted that the explanation for the terminologies is only for illustrative clarity and doesn't limit the coverage and spirit of the present invention.

Figure 3:
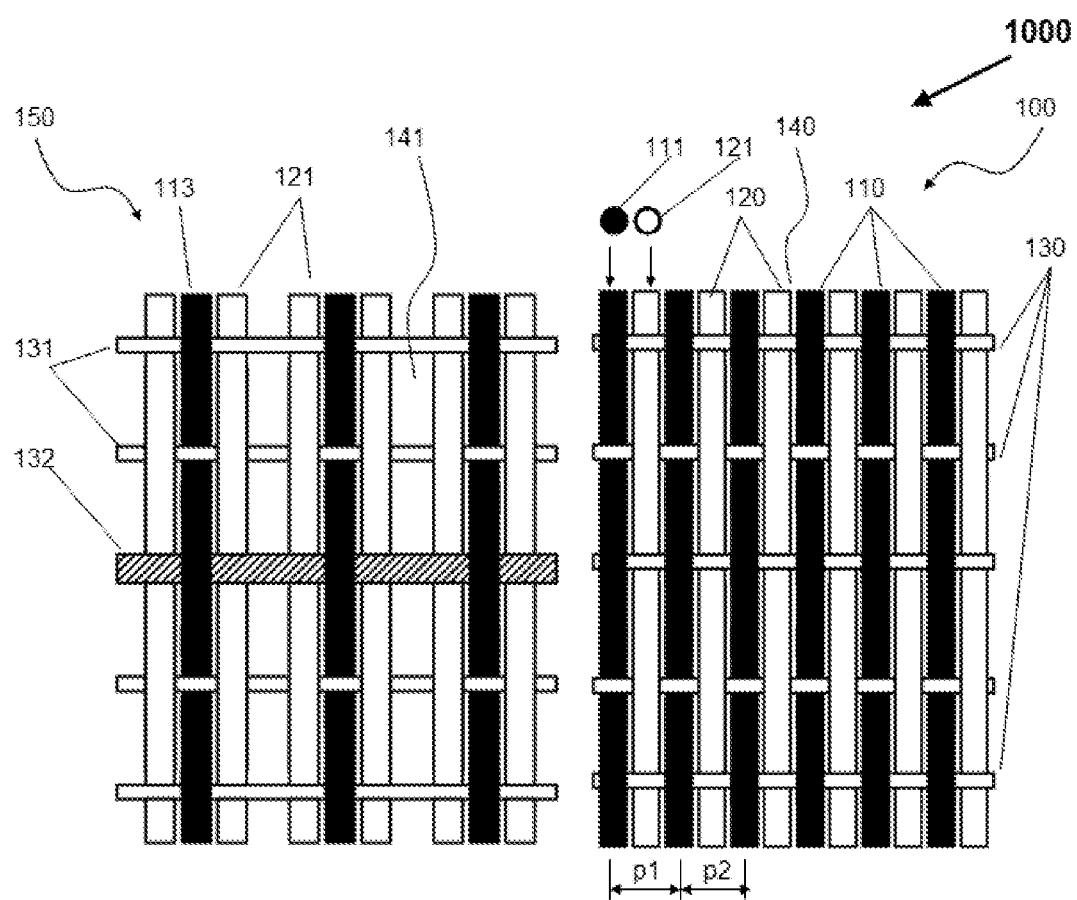
FIG. 3 is a schematic diagram illustrating the hybrid cloth containing metal wires and supportive wires of one embodiment of the present invention.

FIG. 3 is a schematic diagram illustrating the hybrid cloth of one embodiment of the present invention. The hybrid cloth is woven from metal wires and supportive wires in a hybrid way, which is the key element of the present invention. So, it is firstly described in detail with reference to FIG. 3, and then the 2D arrays of metal wires in a layer of hybrid cloth and the 3D arrays of metal wires formed in a plurality of layers of hybrid cloths are further described with reference to FIG. 4 and FIG. 5.

The numerical symbol 1000 in FIG. 3 are schematic diagrams illustrating two examples of a hybrid cloth. In FIG. 3, the hybrid cloth 100 consists of the metal wires 110 in its vertical direction, the supportive wires 120 and 130 respectively in its vertical and horizontal directions, in which the numerical symbol 140 designates the empty space among wires in the hybrid cloth 100, 111 and 112 designate circular metal wires and supportive wires, and p1 and p2 designate the metal wire pitches; and the hybrid cloth 150 consists of the metal wires 113 and supportive wires 121 in its vertical direction, and the supportive wires 131 and metal wires 132 in its horizontal directions, wherein the hybrid cloth 150 contains some other features as compared to the hybrid cloth 100, like the bigger holes or empty space 141 among wires and the metal wires 132 in its horizontal direction. The hybrid cloth with metal wires in both vertical and horizontal directions can be used to make TSV substrates containing a network of metal wires for a specific application. A metal wire pitch means the distance from one metal wire to its neighboring metal wire as shown by p1 and p2 in FIG. 3, which can be determined when weaving a hybrid cloth, and p1 and p2 may be different even though they are the same in the schematic diagram of the hybrid cloth 100. One way to get different metal wire pitches is to place different number of supportive wires between metal wires when weaving a hybrid cloth. When a cloth contains big holes or empty space among wires, the cloth is usually called a mesh cloth, like the hybrid cloth 150 can be called a hybrid mesh cloth. It is noted that even though a circular wire is used as an example for describing the present invention, the metal and supportive wires for the hybrid cloth of the present invention can be other shapes of wires, for example, a fiberglass wire made from a bundle of glass fibers or a flat shape of metal wire. It is further noted that the function of the supportive wires 120 and 130 in a hybrid cloth such as the hybrid cloth 100 in FIG. 3 is to fix the metal wires 110 in the hybrid cloth and arrange them as a 2D array of parallel metal wires with desired pitches.

It is seen from the two examples of hybrid cloths as shown in FIG. 3 that a hybrid cloth has many parameters, including the material and diameter of supportive wires, the hole size among wires, metal wires in one or two directions and so on. By selecting these parameters, some new TSV substrates can be produced, which will be further described when describing the embodiments of the present invention. In order to clearly describe the embodiments of the present invention, the arrays of metal wires in the hybrid cloth and the arrays of metal wires formed in a plurality of layers of hybrid cloths are first described in the following by using the two terminologies, that is, a 2D array of parallel metal wires and a 3D array of parallel metal wires with reference to FIG. 4 and FIG. 5.

Figure 4:
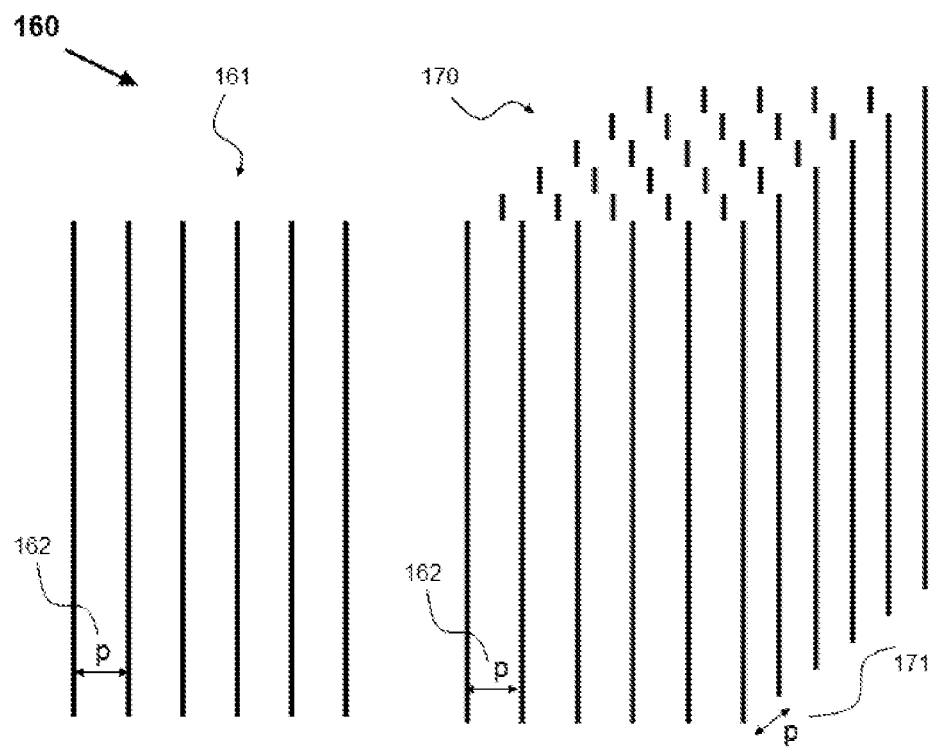
FIG. 4 is a schematic diagram illustrating one type of array of parallel metal wires of one embodiment of the present invention.

The numerical symbols 160 in FIG. 4 shows a type of array of parallel metal wires, in which the numerical symbol 161 designates a 2D array of parallel metal wires with a wire pitch 162, and the numerical symbol 170 designates a 3D array of parallel metal wires with a wire pitch 171 between layers and the wire pitch 162 among wires in a layer. The 3D array of parallel metal wires 170 is formed by stacking a plurality of layers of 2D array of parallel metal wires 161. It is noted that the metal wires 110 contained in the hybrid cloth 100 as shown in FIG. 3 forms such a 2D array of parallel metal wires 161, and when stacking a plurality of layers of hybrid cloths 100 to form a column of layered structure, such a 3D array of parallel metal wires 170 is formed, in which the wire pitch 171 among layers can be determined when making the column of layered structure.

Figure 5:
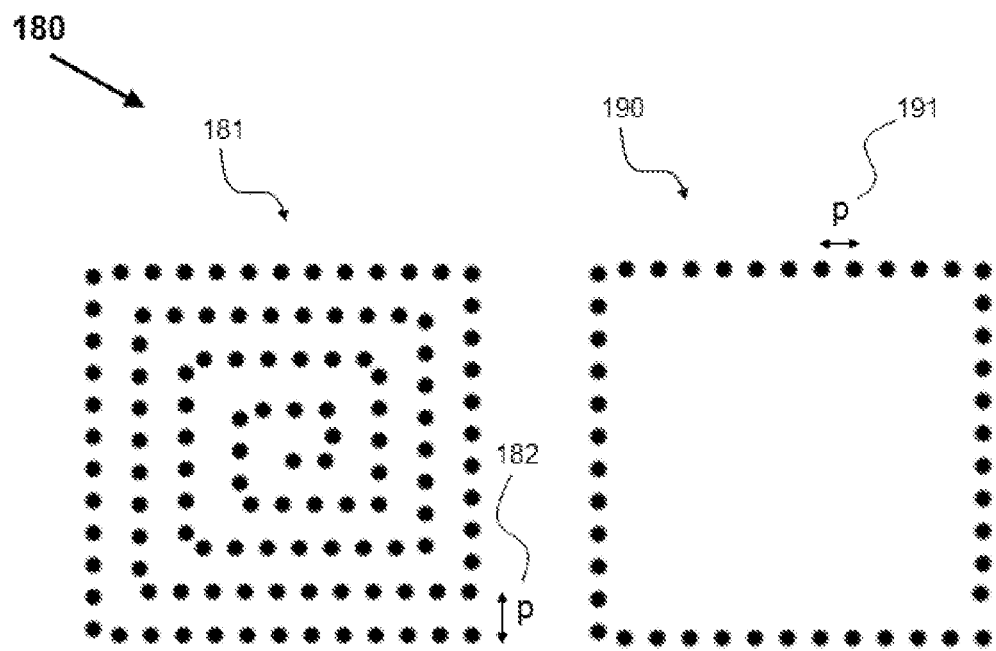
FIG. 5 is a schematic diagram illustrating another type of array of parallel metal wires of one embodiment of the present invention.

The numerical symbols 180 in FIG. 5 shows another type of array of parallel metal wires, which is formed when rolling a long tape of hybrid cloth into a column of layered structure, in which the numerical symbols 181 designates a 3D array of parallel metal wires with a wire pitch 182 among layers and the numerical symbols 190 designates a 2D array of parallel metal wires with a wire pitch 191 in a layer. It is noted that FIG. 5 designates the cross-sectional views of the 3D and 2D arrays of parallel metal wires 181 and 190, the 3D array of parallel metal wires 181 contains a plurality of layers of 2D array of parallel metal wires from its inner to outer layers, and the 2D array of parallel metal wires 190 is the outmost layer of 2D array of parallel metal wires in the 3D array of parallel metal wires 181. It is noted that both types of arrays of parallel metal wires shown in FIG. 4 and FIG. 5 respectively correspond to the stacking type and rolling type of column of layered structure contained in the embodiments of the present invention. For simplicity, the type of array of parallel metal wires shown in FIG. 4 is mainly used for the schematic diagram illustrating the embodiments of the present invention.

Figure 6:
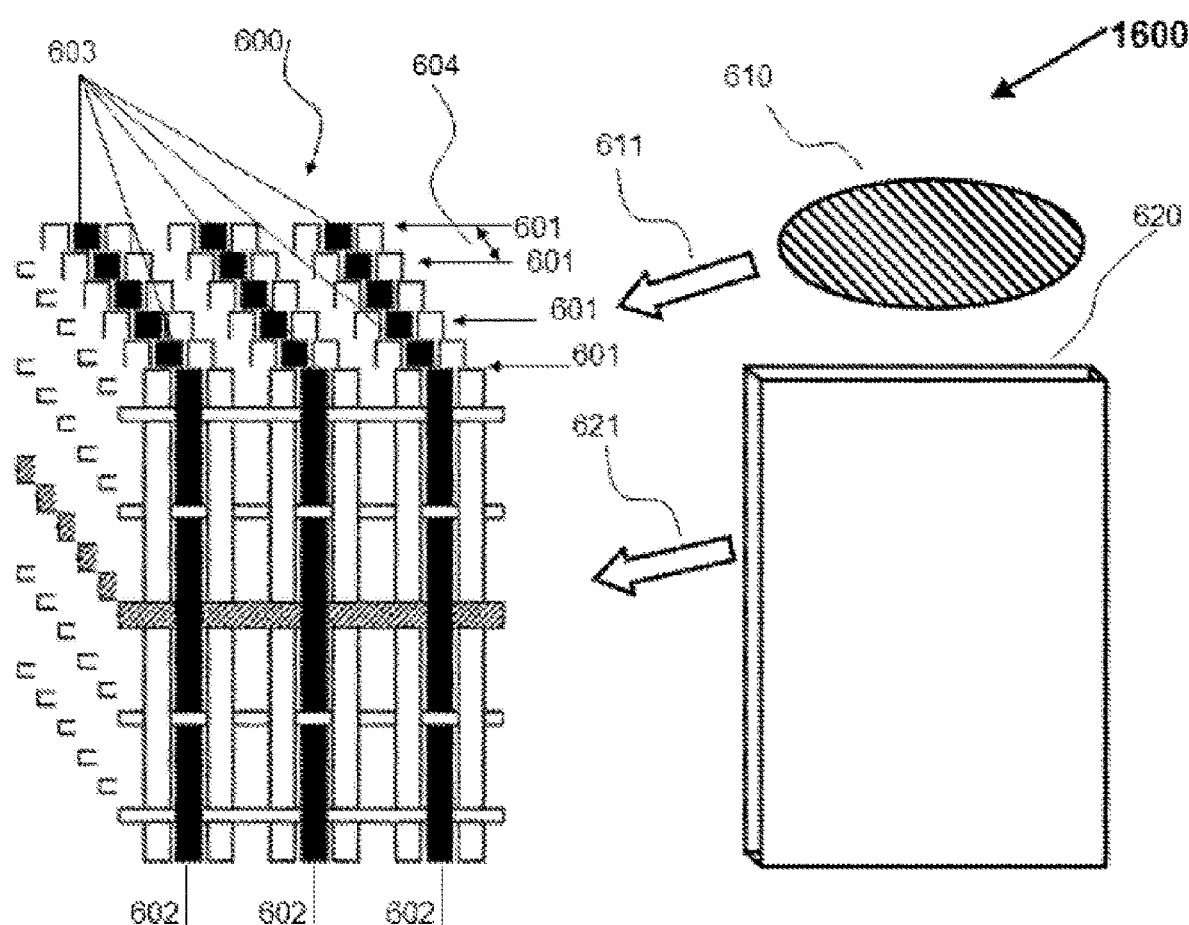
FIG. 6 is a schematic diagram illustrating the major features of the hybrid cloth integrated column of the present invention.

FIG. 6 is a schematic diagram illustrating the major features of the hybrid cloth integrated column for making TSV substrates of the present invention. The numerical symbol 1600 in FIG. 6 illustrates that the hybrid cloth integrated column contains a column of layered structure 600 formed by a plurality of hybrid cloths 601, in which each layer of hybrid cloth is formed by weaving metal wires and supportive wires and contains at least one 2D array of parallel metal wires 602, the plurality of hybrid cloths 601 are arranged so that a pitch 604 is pre-determined between any two neighboring layers of hybrid cloths 601 and the plurality of 2D array of parallel metal wires 602 form at least one 3D array of parallel metal wires 603. Referring to the 3D array of parallel metal wires 170 as shown in FIG. 4, the column of layered structure 600 contains such a 3D array of parallel metal wires. It is seen that if the column of layered structure 600 is packaged by a matrix into a solid entity, called a hybrid cloth integrated column of the present invention, TSV substrates can be produced by slicing it along the direction normal to the direction of the 3D array of parallel metal wires 603. Therefore, as designated by the arrows 611 and 621, a matrix comprising a filling material 610 or a plurality of supportive plates 620 or both of filling material 610 and supportive plates 620 are used to package the column of layered structure 600 in the embodiments of the present invention. As the outline of the matrix will follow the out line of the column of layered structure 600, it is called a column of matrix. In one embodiment of the present invention, the column of matrix comprising a plurality of layers of supportive plates 620 is used for sealing the plurality of hybrid cloths and separating the plurality of hybrid cloths 601 with each other; the plurality of layers of supportive plates 620 are arranged in said column of matrix so that the plurality of layers of supportive plates 620 and said plurality of layers of hybrid cloths 601 form a column of layered structure; and in the column of layered structure, each layer of hybrid cloth 601 is sealed between two layers of supportive plates 620, and any two layers of neighboring hybrid cloths 601 are separated by at least one layer of supportive plate 620. In another embodiment of the present invention, the column of matrix further comprises a filling material 610, which is filled into the empty space among the layers contained in said column of layered structure; a bonding between any two neighboring layers contained in said column of layered structure is obtained by solidifying the filling material 610 so that the column of layered structure is bonded into a solid entity by solidifying the filling material. In one preferable embodiment of the present invention, the column of matrix comprises a filling material 610, which seals the plurality of layers of hybrid cloths 601, the plurality of layers of hybrid cloths 601 are arranged in the column of matrix to form the column of layered structure 600, the column of layered structure 600 and the filling material 610 form a solid entity by solidifying the filling material 610. In the following, a method for making the hybrid cloth integrated column of the present invention is described with reference to FIG. 7 to FIG. 18, in which, more features of the hybrid cloth integrated column of the present invention will be disclosed.

Figure 8:
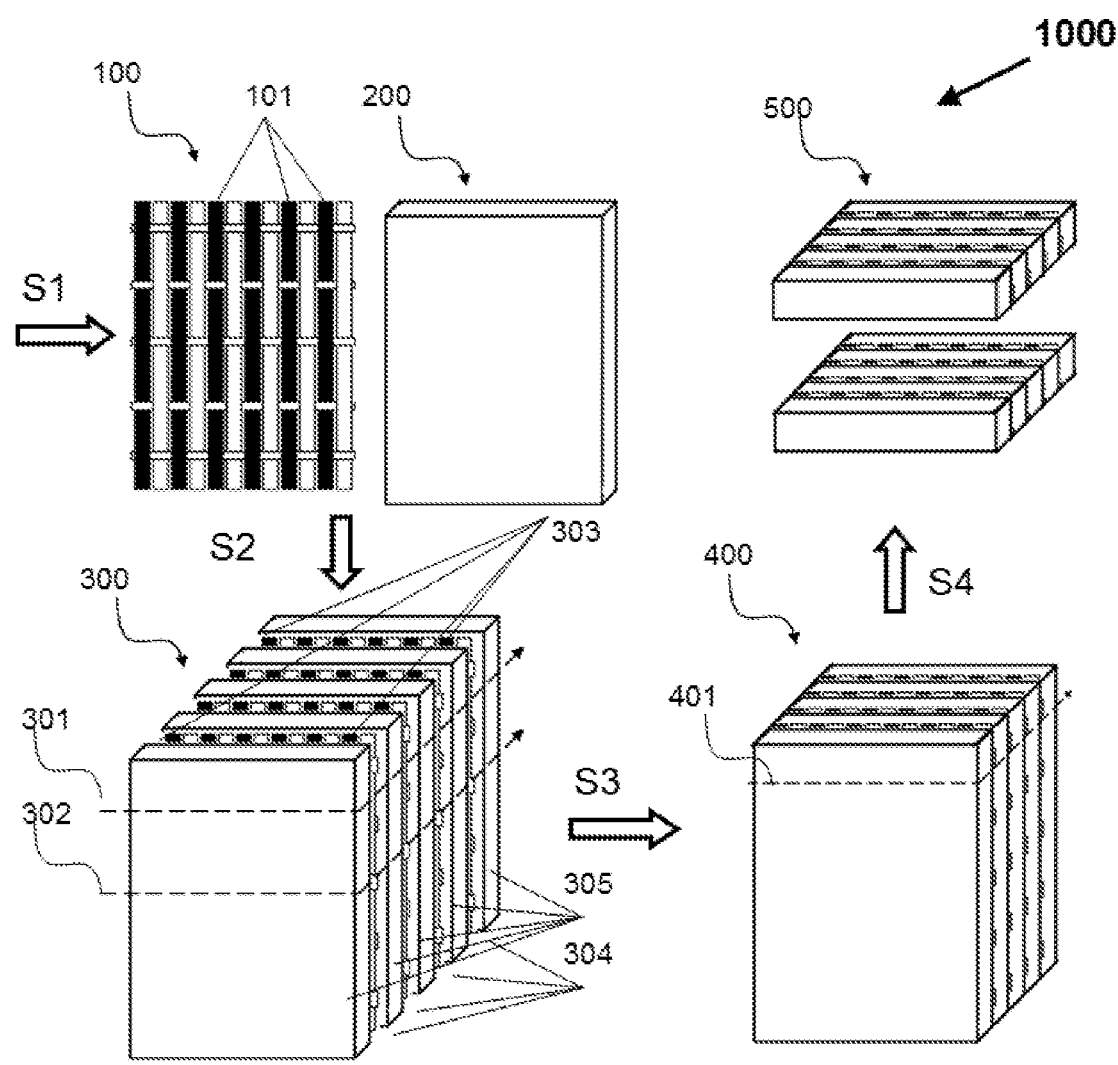
FIG. 8 is a schematic diagram illustrating the method for making TSV substrates, that is, hybrid cloth→column of layered structure→hybrid cloth integrated column→TSV substrates of one embodiment of the present invention.

FIG. 7 and FIG. 8 are a flow-process diagram and a schematic diagram for describing the method for making TSV substrates of one embodiment of the present invention. The processing steps from S1 to S4 as shown in FIG. 6 are described with reference to FIG. 8 in the following.

In the processing step S1 as shown in FIG. 7 and FIG. 8, a hybrid cloth 100 is formed by weaving metal wires and supportive wires in a hybrid way and a supportive plate 200 is prepared, wherein at least a 2D array of parallel metal wires 101 with desired wire pitches is arranged in one direction of the hybrid cloth during weaving it.

In the processing step S2 as shown in FIG. 7 and FIG. 8, a column of layered structure 300 is formed by using the hybrid cloth 100 and the supportive plate 200, which contains a plurality of layers of hybrid cloths 304 and a plurality of layers of plates 305, wherein the supportive plates 305 are used for fixing the hybrid cloths, separating one layer of hybrid cloth from another layer of hybrid cloths and setting the metal wire pitch between two layers of hybrid cloths, that is, any two neighboring layers of hybrid cloths 304 are separated by at least one layer of supportive plate 305, and wherein the plurality of 2D arrays of parallel metal wires contained in the plurality of layers of hybrid cloths are fixed in the column of layered structure 300 and arranged as a 3D array of parallel metal wires 303 by the supportive plates and hybrid cloths. It is noted that the supportive plates 305 can have various geometric structure, which will be described in the further description for the embodiments of the present invention, and the arrows designated by the numerical symbols 301 and 302 illustrate two typical cross-sections of the column of layered structure 300 where the hybrid cloths 304 don't have and have the horizontal supportive wires, respectively. It is further noted that in the processing step S2, it is a selection to use a filling material in and/or around the empty space of the column of layered structure 300, which will be described in the further description for the embodiments of the present invention.

In the processing step S3 as shown in FIG. 7 and FIG. 8, all the layers of hybrid cloths 304 and supportive plates 305 contained in the column of layered structure 300 are made into a solid entity by using a designed condition so as to form a hybrid cloth integrated column 400 containing a 3D array of parallel metal wires, in which the arrow dot line designated by the numerical symbol 401 illustrates the direction normal to the direction of the 3D array of parallel metal wires, along which the hybrid cloth integrated column 400 are sawed into slices in the next processing step S4. It is noted that the designed condition used for making all the layers of hybrid cloths 304 and supportive plates 305 into a solid entity depends on if a filling material is used in the processing step S2, which will be described in the further description for the embodiments of the present invention.

In the processing step S4 as shown in FIG. 7 and FIG. 8, the hybrid cloth integrated column 400 is sawed along the direction normal to the direction of the 3D array of parallel metal wires into slices so as to produce a plurality of TSV substrates 500.

The hybrid cloth 100 formed in processing step S1 has been described in detail with reference to FIG. 3, FIG. 4 and FIG. 5 in the above; two major interface structures among the layers in the column of layered structure 300 taken place in the processing step S2, the corresponding means to join or bond the layers in the column of layered structure 300 together into a solid entity in the processing step S3, and the selection for the supportive plate 200 will be described in detail with reference to FIG. 9 to FIG. 15 in the following.

Figure 9:
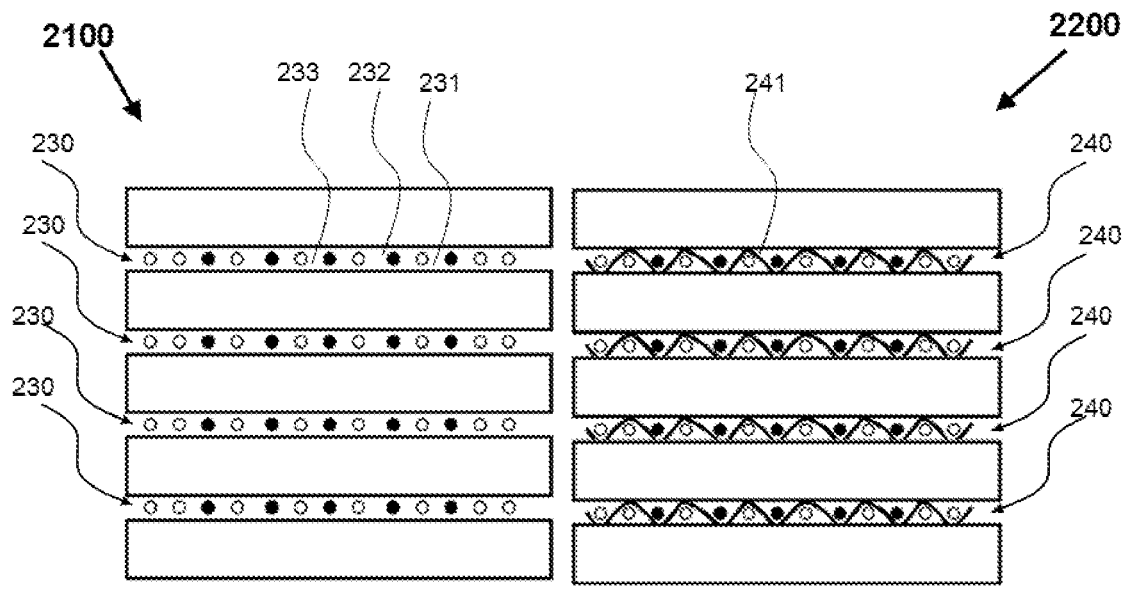
FIG. 9 is a schematic diagram illustrating the cross-sectional view of the column of layered structure of one embodiment of the present invention.

In FIG. 9, the numerical symbols 2100 and 2200 designate two typical cross-sections of the column of layered structure 300 taken at the positions as shown by 301 and 302 in FIG. 8 and are for illustrating two typical interface structures among the layers in the column of layered structure 300. The cross-section 2100 of the column of layered structure 300 is taken at a position where the column of layered structure 300 doesn't contain the horizontal supportive wires, in which the numerical symbol 230 indicates the layers of hybrid cloths at the position, and also indicates the interface structure at the position; and the cross-section 2200 of the column of layered structure 300 is taken at a position where the column of layered structure 300 contains the horizontal supportive wires, in which the numerical symbol 240 indicates the layers of hybrid cloths at the position, and also indicates the interface structure at the position. It is seen from the interface structure illustrated by 240 that the pitch or distance between two supportive plates is bigger than the diameter of the metal wires because of the presence of the horizontal supportive wires 241. So, besides the empty space 231 among wires in each hybrid cloth, the column of layered structure 300 also contains the empty space 232 and 233 between the layer of supportive plate and the layer of hybrid cloth. All the empty space designated by 231, 232 and 233 are called the empty space contained in the column of layered structure 300. It is noted that when weaving the hybrid cloth 100 in the processing step S1 and as shown in FIG. 8, a small amount of horizontal supportive wires can be used so that the portion of the column of layered structure 300 without the horizontal supportive wires is its major portion, that is, the portion of the column of layered structure 300 having the cross-section 2100 is dominant in the whole column of layered structure 300.

Figure 10:
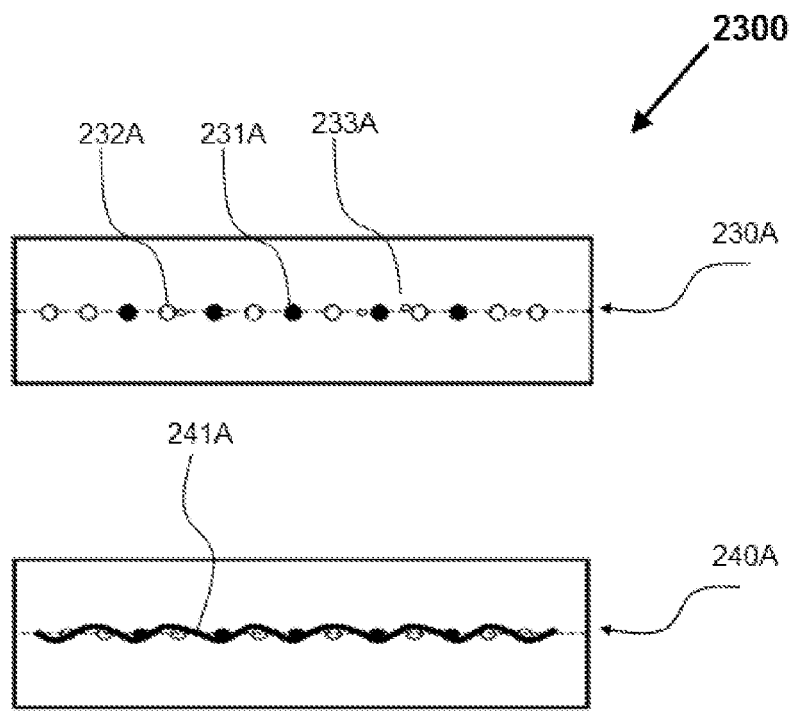
FIG. 10 is a schematic diagram illustrating the layers joined together at their interfaces by using a designed temperature and pressure of one embodiment of the present invention.
Figure 11:
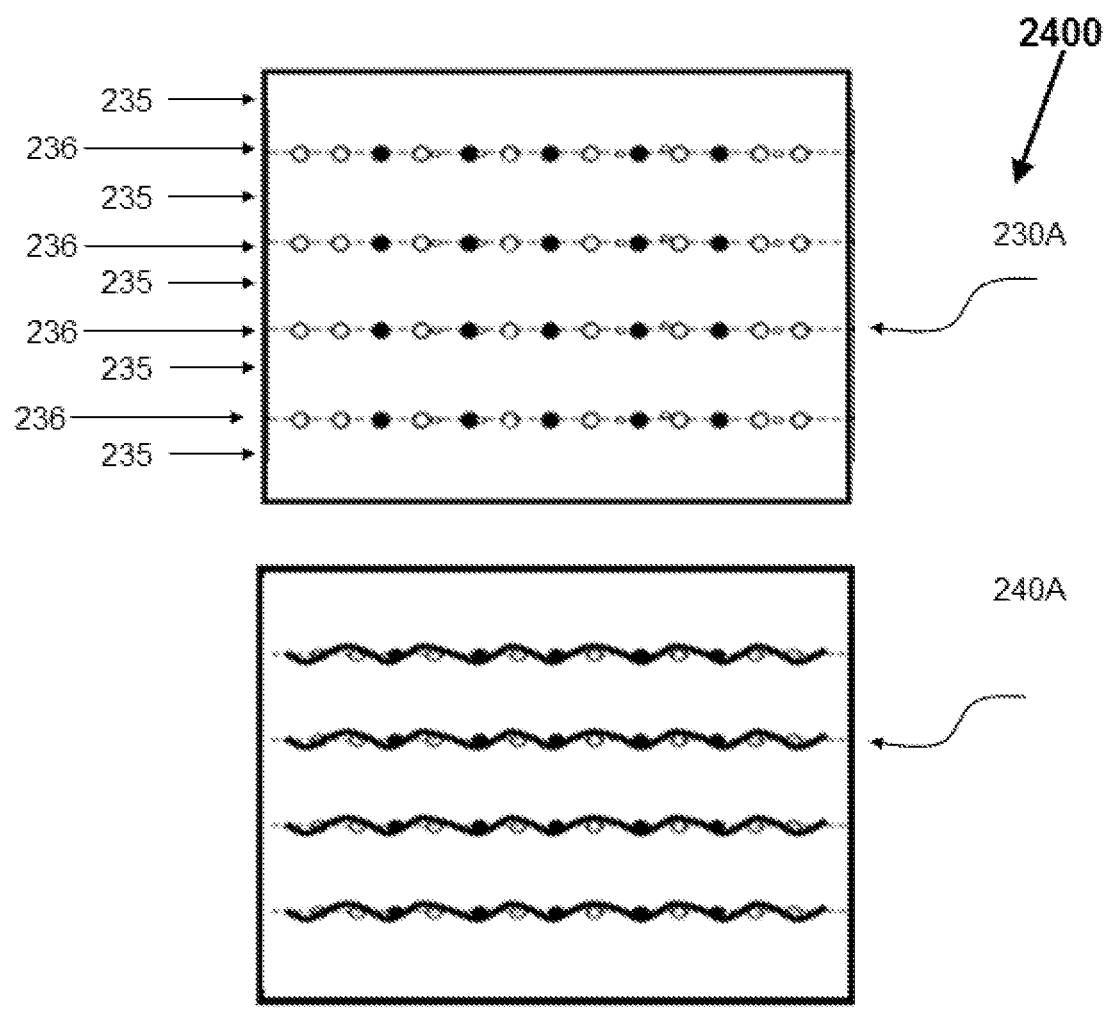
FIG. 11 is a schematic diagram illustrating the cross-sectional view of the hybrid cloth integrated column formed by joining the column of layered structure by using the designed temperature and pressure of one embodiment of the present invention.

A means to make the layers in the column of layered structure 300 into a solid entity in the processing step S3 are described in detail in the following, including a means by using a designed temperature and pressure and a means by using and solidifying a filling material. As shown in FIG. 10, the means as illustrated by numerical symbol 2300 to make the layers in the column of layered structure 300 into a solid entity is to press the column of layered structure 300 under a designed temperature and pressure so that the layers tightly contact with each other at their interfaces and join together, forming a joining between any two layers contained in the column of layered structure 300, in which the numerical symbols 230A and 240A designate the joining planes corresponding to the interface structures 230 and 240 contained in the column of layered structure 300 as shown in FIG. 9, and 231A and 232A designate the metal wires and supportive wires at the joining plane 230A, 233A designate some holes which may take place at or near the joining plane 230A, and 241A designates the supportive wires at the joining plane 240A. It is noted that the supportive wires can be selected and designed to enhance the adhesion among the layers at their joining planes. The numerical symbol 2400 in FIG. 11 illustrate the two typical cross-sectional planes of the hybrid cloth integrated column formed by using the means of temperature and pressure to join the layers in the column of layered structure 300, in which 230A and 240A indicate the portions of the hybrid cloth integrated column without and with the horizontal supportive wires, respectively, and which portion, with the cross-section 230A or 240A, is more dominant can be determined by designing the horizontal supportive wires in the hybrid cloth, 235 and 236 designates the plurality of supportive plates and hybrid cloths, and it is seen from FIG. 11 that each layer of hybrid cloth 236 is sealed between two supportive plates 235.

Figure 12:
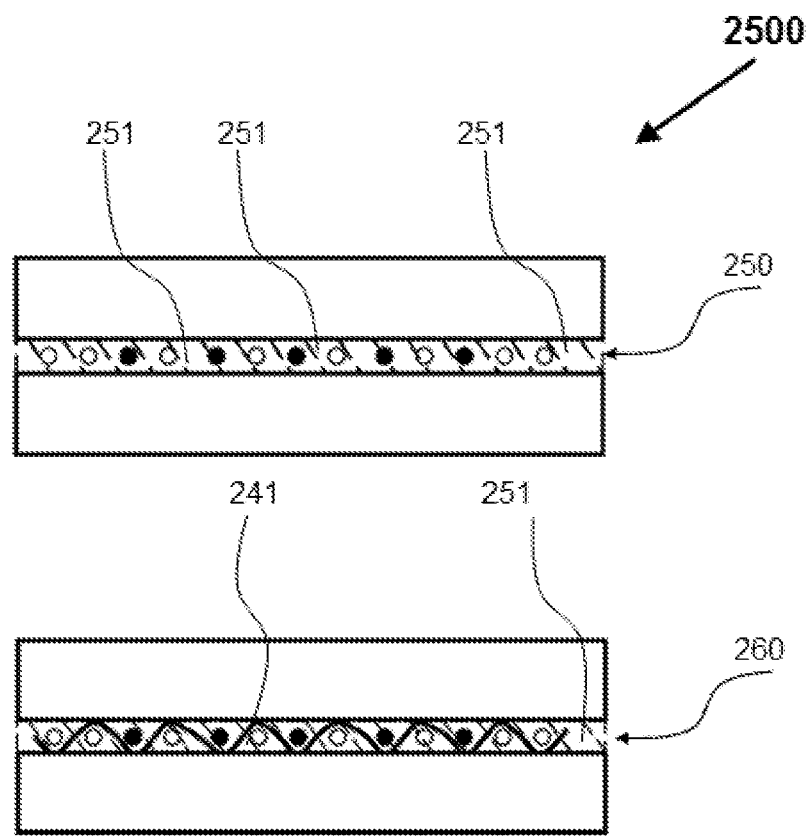
FIG. 12 is a schematic diagram illustrating the layers joined together at their interfaces by filling and solidifying a filling material into the empty space in the column of layered structure of one embodiment of the present invention.
Figure 13:
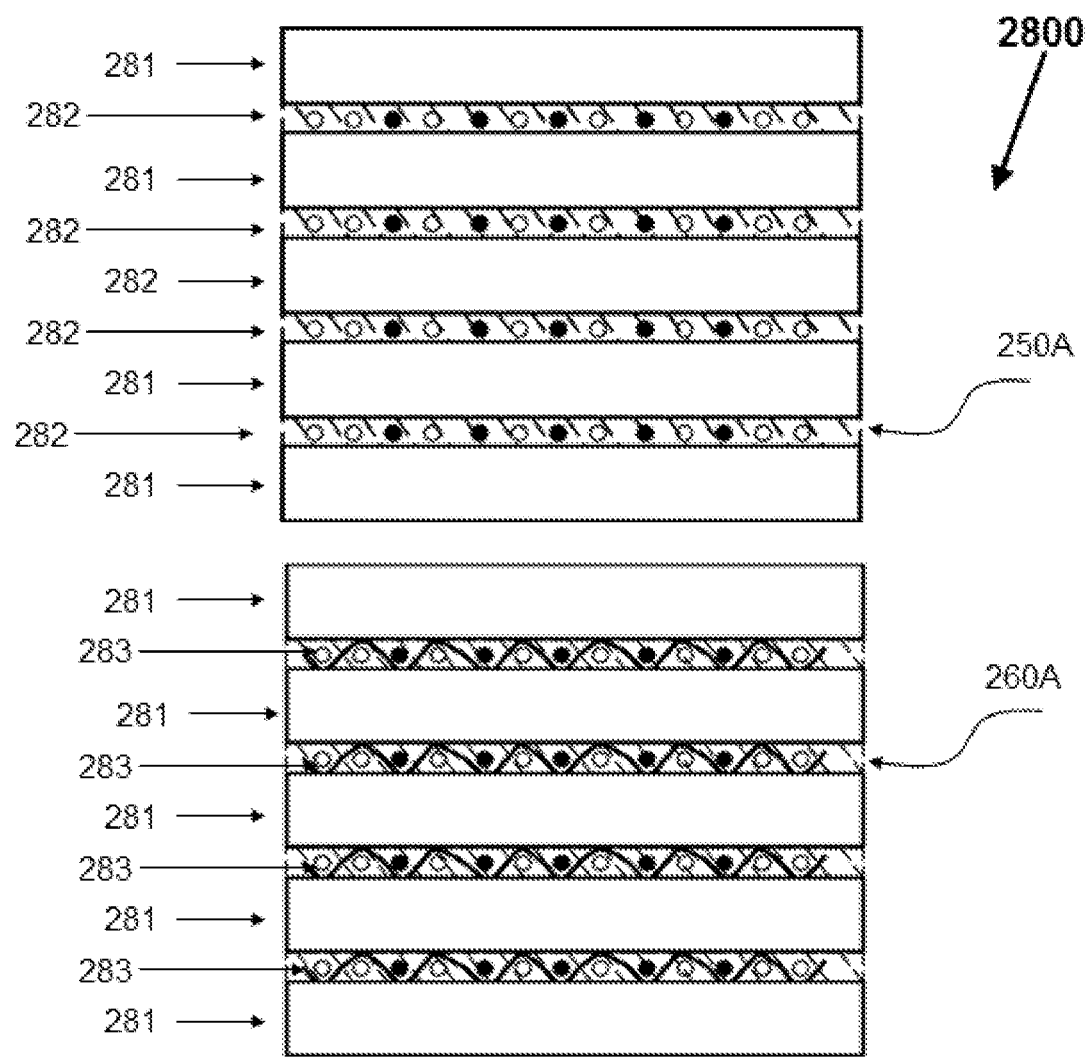
FIG. 13 is a schematic diagram illustrating the cross-sectional view of the hybrid cloth integrated column formed by joining the column of layered structure by using the filling material of one embodiment of the present invention.

As shown in FIG. 12, a means as illustrated by numerical symbol 2500 to make the layers in the column of layered structure 300 into a solid entity is to fill in the empty space of the column of layered structure 300 with a filling material 251, in which the numerical symbols 250 and 260 designate the interface structures having the filling material 251 corresponding to the interface structures 230 and 240 contained in the column of layered structure 300 as shown in FIG. 9, then solidify the filling material 251 so that a bond between any two layers in the column of layered structure 300 is formed, and all the layers in the column of layered structure 300 are bonded together into a solid entity, forming the hybrid cloth integrated column 400 as shown in FIG. 8. The numerical symbol 2600 in FIG. 13 illustrates two typical cross-sectional planes of the hybrid cloth integrated column formed by using the filling material 251 to bond the layers in the column of layered structure 300, in which 250A and 260A indicate the portions of the hybrid cloth integrated column without and with the horizontal supportive wires, respectively, and which portion with the cross-section 250A or 260A is more dominant in the hybrid cloth integrated column can be determined by designing the horizontal supportive wires in the hybrid cloth, and it is seen from FIG. 13 that each layer of hybrid cloth 283 is sealed between two supportive plates 281 by the filling material 282.

The means by using a designed temperature and pressure to make the layers in the column of layered structure 300 into a solid entity as shown in FIG. 10 is relatively simple, but the major matrix material in the hybrid cloth integrated column 400 based on the means can only be made from the supportive plate 200. Even though there are more processing steps in the means by using the filling material 282 to bond the layers in the column of layered structure 300 together into a solid entity as shown in FIG. 13, there are two material parameters, that is, the filling material and the supportive plate for designing the matrix in the hybrid cloth integrated column 400. By selecting the structure of the supportive plate, the major portion of matrix in the hybrid cloth integrated column 400 can be selectively determined as the filling material, which will be further described in the following.

In one selection of the supportive plate 200 as designated by 5000 in FIG. 8, a porous supportive plate is used. The numerical symbol 500 in FIG. 14 designates a porous supportive plate used in the embodiment of the present invention as shown in FIG. 8 and in its corresponding hybrid cloth integrated column, 501 in FIG. 14 designates the holes in the porous supportive plate 500. When using the porous supportive plate 500 in the embodiment of the present invention as shown in FIG. 8 and filling the filling material into the empty space in and around the column of layered structure 300 as shown in FIG. 8, the hybrid cloth integrated column as designated by 520 in FIG. 14 can be produced, in which the numerical symbol 520 illustrates a cross-sectional plane of the hybrid cloth integrated column at the position without the horizontal supportive wires, and 520 also designates the top view of a TSV substrate, and 516 designates the filling materials in the empty space in and around the column of layered structure 300 and in the holes 501 of the porous supportive plate 500. Because all the filling materials are solidified in the meantime, they can thoroughly and reliably join together and form the major portion of the matrix of the hybrid cloth integrated column 520. It is noted that corresponding to the metal wires 513, the matrix of the hybrid cloth integrated column or TSV substrates designated by the cross-sectional plane 520 includes the filling material 516, the porous supportive plate 514 and the supportive wires 515 in the hybrid cloths. So, the matrix of the TSV substrate 520 is not a uniform material as that in the traditional TSV substrates. As the materials of the porous supportive plate 514 and the supportive wires 515 can be selected to be electrically non-conductive, they will not affect the electric performance of the TSV substrate 520. Moreover, the mechanical and thermal properties of the TSV substrate 520 can be improved by selecting and designing the material and structure of the porous supportive plate 514 and the supportive wires 515.

In another selection of the supportive plate 200 as shown in FIG. 8, a supportive mesh cloth is used. The numerical symbol 5400 in FIG. 15 designates a supportive wire cloth 540 used in the embodiment of the present invention as shown in FIG. 8, in which the numerical symbols 541, 542 and 543 designate the horizontal supportive wires, vertical supportive wires, and the holes in the supportive mesh cloth 540 respectively; the numerical symbol 530 designates a major cross-sectional plane of the hybrid cloth integrated column at the position designated by arrow dot line 544 or the top view of the TSV substrate produced by using the supportive mesh cloth 540 in the embodiment of the present invention as shown in FIG. 8, in which the 533 designates metal wires, and 534, 535 and 536 designate the supportive wires from the supportive mesh cloth 540, the supportive wires from the hybrid cloth, and the filling material respectively; and as far as the metal wires 533 are mentioned, the matrix of the TSV substrate 530 consists of the materials 534, 535 and 536, which can be selected and designed to improve the mechanical and thermal properties of the matrix of the TSV substrate 530. It is noted that for a composite body containing several materials, the matrix of the composite body is a relative concept, depending on which element is mentioned. For example, in the hybrid cloth integrated column 530, if the metal wires 533 are mentioned, the matrix include all the materials except the metal wires 533, that is, the matrix consists of the supportive wires 534, the plurality of layers of supportive mesh cloths 537 and the filling material 536; and if the plurality of layers of hybrid cloths 538 are mentioned, the matrix consists of the plurality of layers of supportive mesh cloths 537 and the filling material 536.

In the processing step S2 as shown in FIG. 8 of the embodiment of the present invention, the column of layered structure 300 is formed by using the supportive plate 200 and the hybrid cloth 100. Some preferable ways to form the column of layered structure 300 is described in the following.

Figure 16:
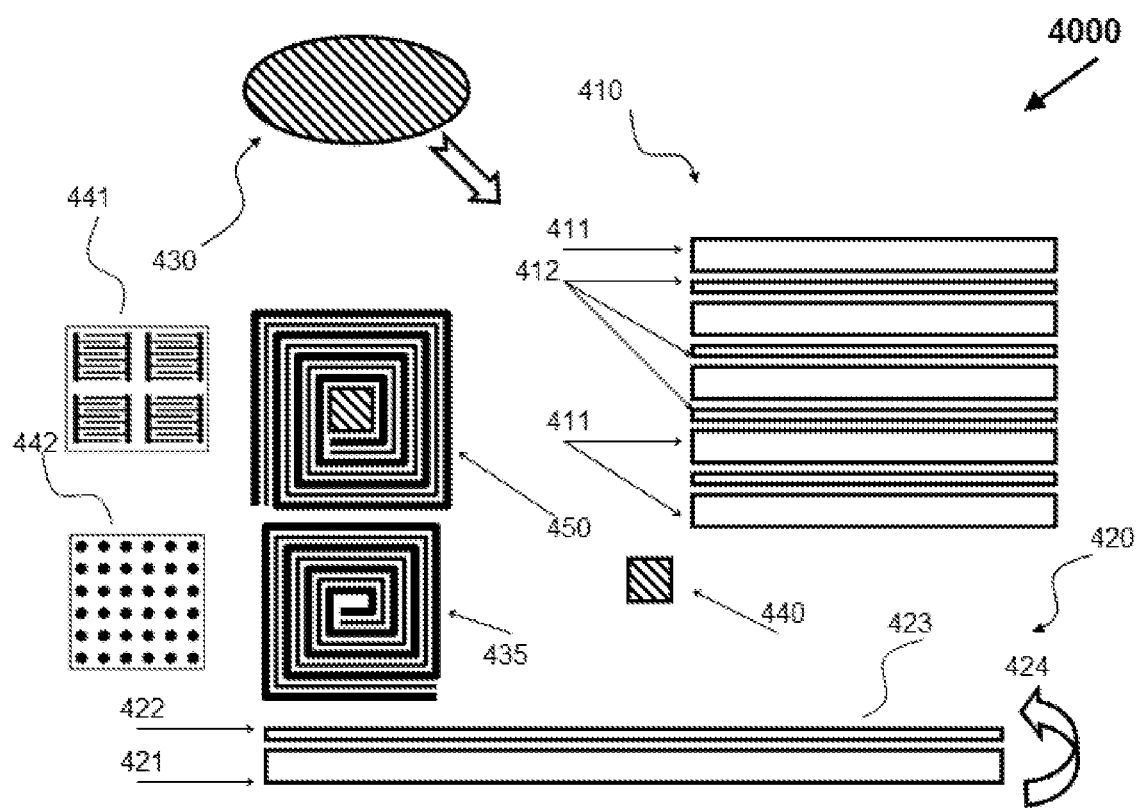
FIG. 16 is a schematic diagram illustrating the column of layered structure formed by stacking or rolling the hybrid cloth and the supportive plate of one embodiment of the present invention.

The numerical symbol 4000 in FIG. 16 designates two preferable ways as designated by the numerical symbols 410 and 420 in FIG. 16 to form the column of layered structure 300 as shown in FIG. 8. In FIG. 16, the way designated by 410 illustrates to form a column of layered structure by stacking a plurality of pieces of hybrid cloths 412 and a plurality of pieces of supportive plates 411 into a stacked type of layered structure, wherein any two neighboring pieces of hybrid cloths 412 are separated by at least one piece of supportive plate so that the metal wires electrically insulate from each other; the way designated by 420 illustrates to form a column of layered structure by stacking a tape of hybrid cloth 422 and a tape of supportive plate 421 into a dual layer of tape 423, then as shown by the arrow 424, rolling the dual layer of tape 423 into a rolled type of layered structure 435 or rolling the dual layer of tape 423 around a column core 440 into a rolled type of layered structure 450, in which the column core 440 can contain some metal structures as shown by the numerical symbol 441 and 442; and 430 designates a filling material and the arrow indicates that the filling material 430 can be deposited on the hybrid cloth and the supportive plate or one of them first, then the hybrid cloth and supportive plate is stacked or rolled into a layered structure. As compared to the stacking way to form the column of layered structure, a column core can be included in the column of layered structure formed by the rolling way. It is noted that in the rolling way, it is not limited to roll a dual layer of tape; a column of layered structure can also be formed by rolling a multiple layer of tape. It is further noted that a stacked type of layered structure can also be formed by rolling the dual layer of tape 423 or a multiple layer of tape around a multiple side of column so that a stacked type of layered structure can be formed on each side of the multiple side of column.

In summary, the ways to form a column of layered structure by using the hybrid cloth and the supportive plate of the embodiment of the present invention as shown in FIG. 16 include the stacking and rolling ways, in which the column core can be added into the column of layered structure formed by the rolling way, and the filling material can be deposited on the hybrid cloth and the supportive plate or one of them first, then the hybrid cloth and plate with the filling material is formed into the column of layered structure by using the stacking or rolling ways, or the filling material can be filled into the column of layered structure after it is formed first. The selection for depositing the filling material on the hybrid cloth or the supportive plate first or filling it into the column of layered structure later can be determined by referring to the structures of the supportive plate and hybrid cloth. It is noted that a container or other assisting tools may be needed for carrying out the processing steps as shown in FIG. 8 or FIG. 16, and these conventional ways for carrying out the processing steps are not depicted herein for simplicity.

In another preferable embodiment of the present invention, a column of layered structure and a hybrid cloth integrated column are formed by using an assisting framework, and TSV substrates are further produced, which is described in the following.

Figure 2:
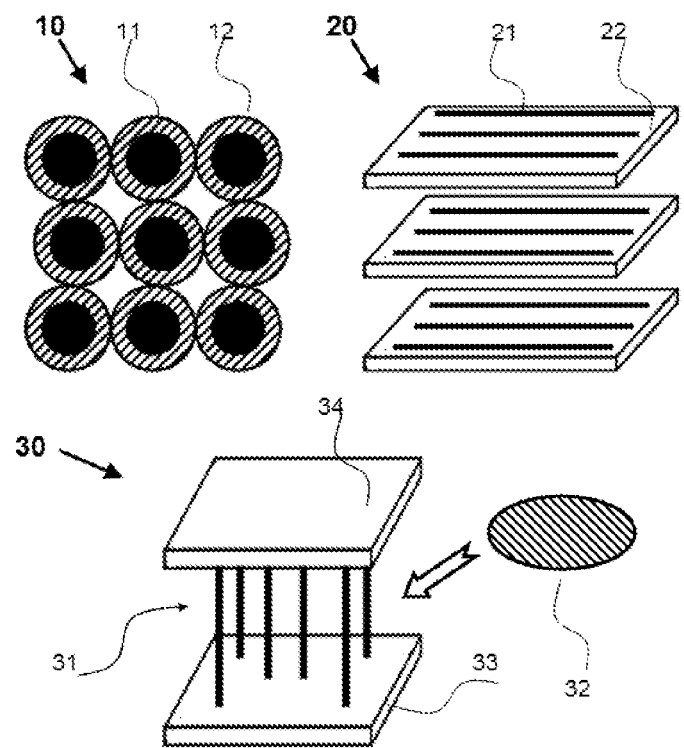
FIG. 2 is a schematic diagram illustrating the three types of macro methods for making TSV substrates of prior arts
Figure 17:
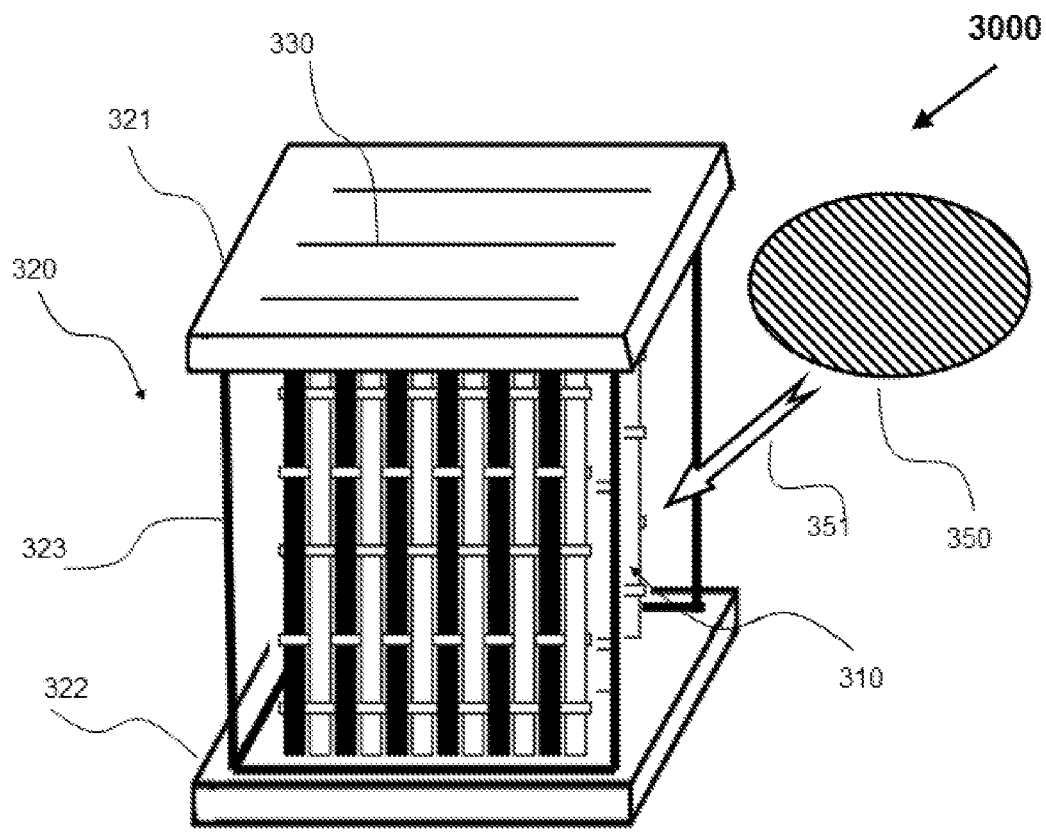
FIG. 17 is a schematic diagram illustrating the method for forming the hybrid cloth integrated column by using a framework and a filling material and further making TSV substrates of one embodiment of the present invention.

As shown by the numerical symbol 3000 in FIG. 17, a container of framework 320 contains the clamping plates 321/322 and the side wall 323, in which the numerical symbol 330 designates that the plurality of pieces of hybrid cloths 310 are fixed in the container of framework 320 with two ends of each piece of hybrid cloth 310 being clamped by the clamping plates 321/322, and are arranged as a column of layered structure 310 with the pitches among the layers of the column of layered structure being set by the clamping plates 321/322. Then, as shown by the arrow 351, a filling material 350 is filled into the container of framework 320 so that the empty space in and around the column of layered structure 310 is filled by the filling material 350, and then the filling material 350 is solidified by using a designed condition so that a hybrid cloth integrated column consisting of the solidified filling material 350 and the column of layered structure 310 is formed. It is noted that due to the usage of the hybrid cloths 310 of the embodiment of the present invention, the metal wires are well fixed in the framework 320. So, the drawback in the method of prior arts as shown by the numerical symbol 30 in FIG. 2, that is, the metal wires are easy to be moved or broken when filling a filling material into the empty space among the metal wires is resolved in the embodiment of the present invention.

The numerical symbol 5800 illustrates the cross-sectional plane of the hybrid cloth integrated column or the top view of the TSV substrate formed in the embodiment of the present invention as showed in FIG. 17, it is seen that the hybrid cloth integrated column 5800 consists of a plurality of layers of hybrid cloths 580 and a matrix 583, wherein 580 is sealed in 583.

Figure 15:
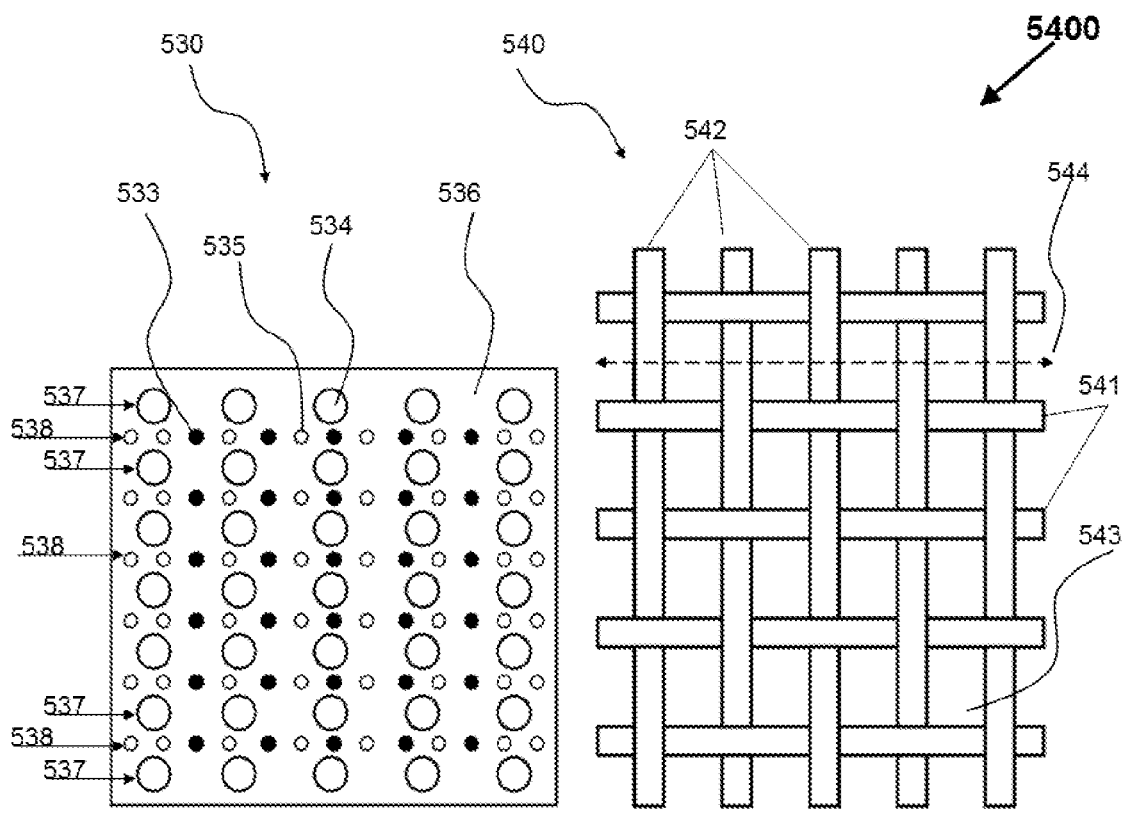
FIG. 15 is a schematic diagram illustrating the cross-sectional view of the hybrid cloth integrated column formed by using a supportive cloth as the supportive plate of one embodiment of the present invention.

It is noted that the selection for the materials used for producing the hybrid cloth integrated column and further producing the TSV substrates in the embodiments of the present invention can be very flexible, which is clarified herein. There are four materials involved in one or more embodiments of the present invention, including the metal wire, supportive wire, supportive plate and filling material. The metal wire can be copper wire, tungsten wire, copper wire with being coated with ceramic or glass coating and so on, the supportive wire can be fiberglass wire, plastic wire, cotton wire and so on, the supportive plate can be a piece of fiberglass cloth, a piece of green ceramic tape, a piece of glass, or a piece of plastic material and so on, and the filling material can be a liquid type of polymer material, a paste type of ceramic or glass material, an ink type of molding material, a paste type of metal material, a powder type of silicon, ceramic or glass and so on. In general, a set of materials can be selected and used in the embodiments of the present invention provided that the set of materials can go through all the processing steps of the embodiments of the present invention without failing to make the hybrid cloth integrated column. Some examples for the sets of materials used in the embodiments of the present invention include: 1) using copper wires and fiberglass wires for the hybrid cloth, and fiberglass cloth for the supportive plate for making the TSV substrates as shown in FIG. 11 of the embodiment of the present invention, TSV glass substrates can be produced in the embodiment of the present invention; 2) using copper wires and fiberglass wires for a hybrid mesh cloth, fiberglass mesh cloth for the supportive plate and a paste type of low temperature fired ceramic (LTCC) for making the TSV substrates as shown in FIG. 15 of the embodiment of the present invention, TSV ceramic substrates can be produced in the embodiment of the present invention; 3) using copper wires and fiberglass wires for the hybrid cloth and a paste type of low temperature fired ceramic (LTCC) for making the TSV substrates as shown FIG. 18 of the embodiment of the present invention, TSV ceramic substrates can be produced in the embodiment of the present invention; 4) in the above case of 2) or 3), using low melting point of metal material, such as aluminum or aluminum alloy as the filling material and copper wires with being coated with ceramic or glass coating, TSV aluminum substrate can be produced; and 5) when using tungsten wires as the metal wires in the hybrid cloth, a paste type of high temperature fired ceramic or a powder type of silicon can be used as the filling material so that a high temperature ceramic of TSV substrates can be produced in the embodiments of the present invention. It is seen that the material set for making TSV substrates according to the embodiments of the present invention can be flexibly determined based on the requirements for a specific application.

Figure 19:
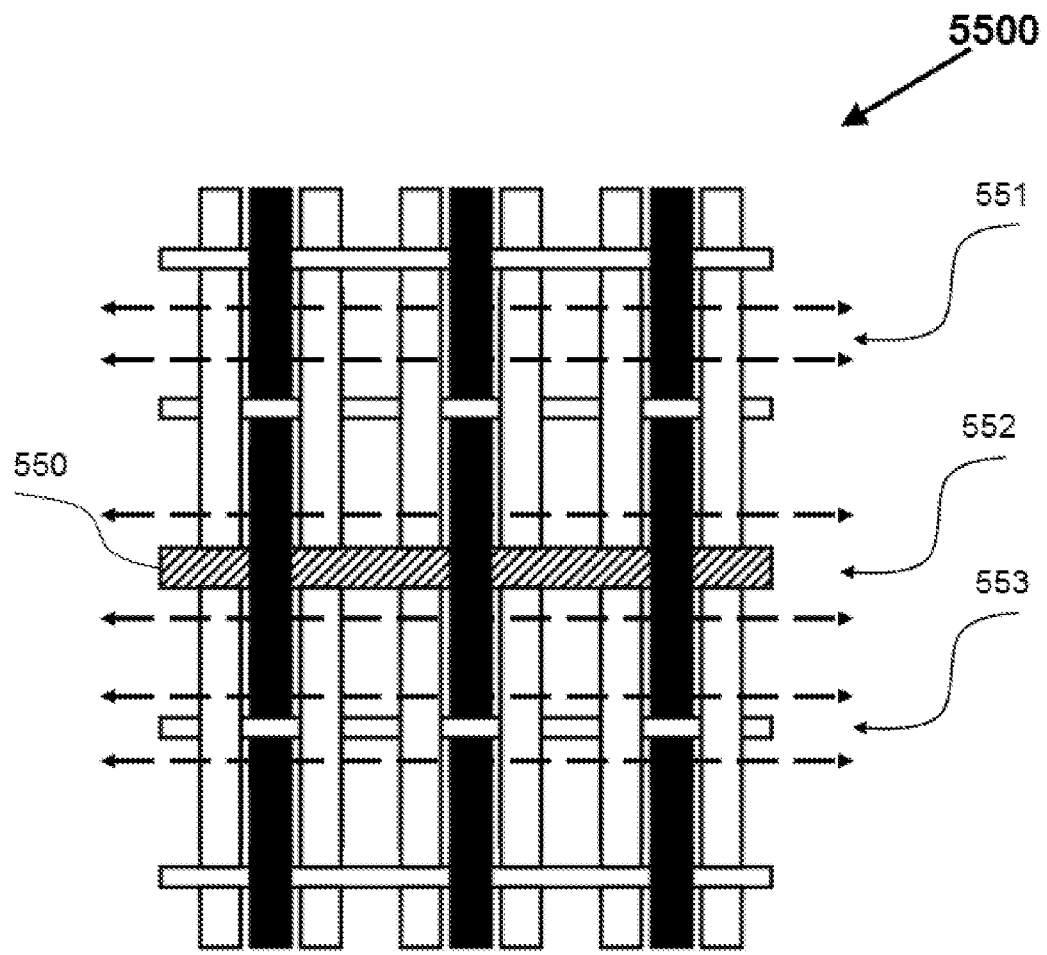
FIG. 19 is a schematic diagram illustrating the various positions corresponding to the hybrid cloth at which the hybrid cloth integrated column is sawed into slices of one embodiment of the present invention.

The numerical symbol 5500 in FIG. 19 shows a hybrid cloth used in one embodiment of the present invention, which contains metal wires 550 in its horizontal direction besides the 2D array of parallel metal wires in its vertical direction, forming a network of metal wires, in which the arrow dot lines 551, 552 and 553 illustrate the various positions to saw the hybrid cloth integrated column for producing various types of TSV substrates from the same hybrid cloth integrated column based on the hybrid cloth 5500.

The numerical symbol 5600 in FIG. 20 designates a typical hybrid cloth integrated column of the present invention, which is used with reference to the hybrid cloth integrated columns as shown in FIG. 11, FIG. 13, FIG. 14, FIG. 15 and FIG. 18 of the embodiments of the present invention to describe the features of the hybrid cloth integrated column of the present invention in the following.

Figure 14:
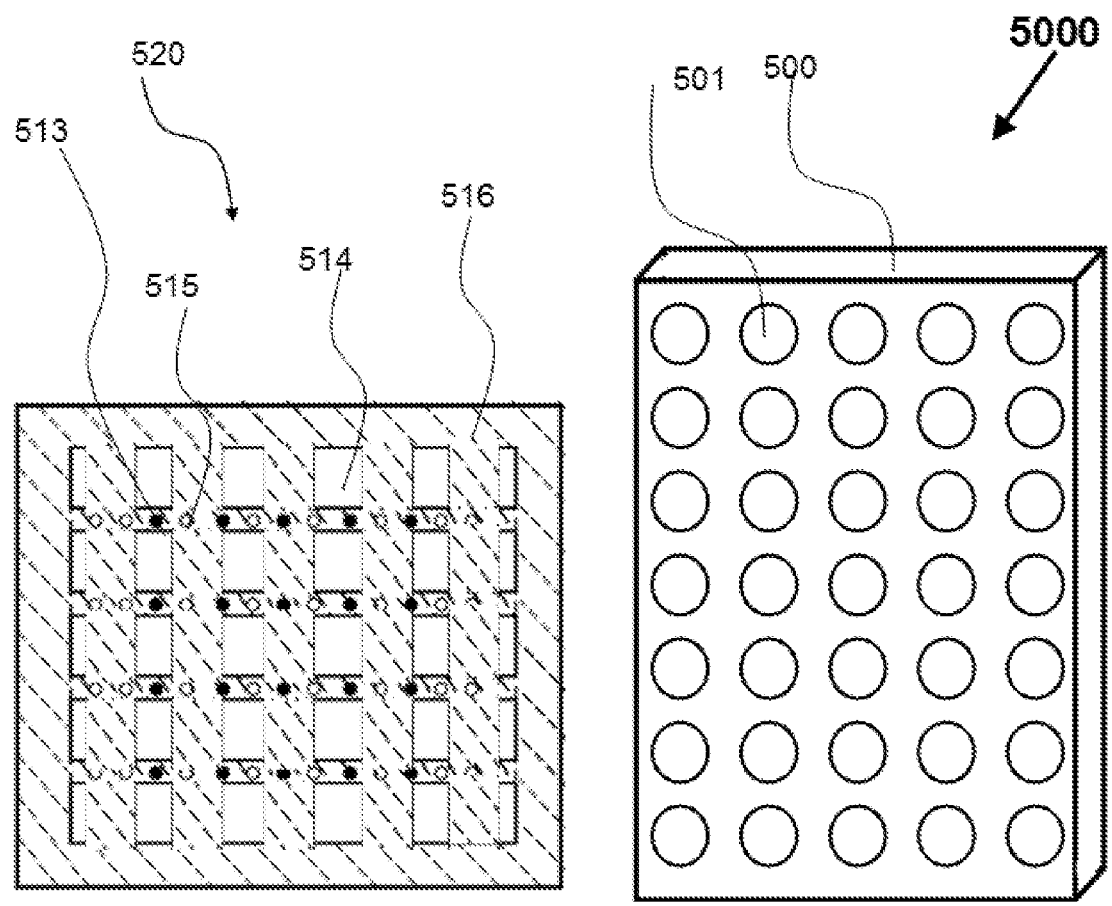
FIG. 14 is a schematic diagram illustrating the cross-sectional view of the hybrid cloth integrated column formed by using a porous supportive plate and a filling material filling into the empty space in and around the column of layered structure of one embodiment of the present invention.
Figure 18:
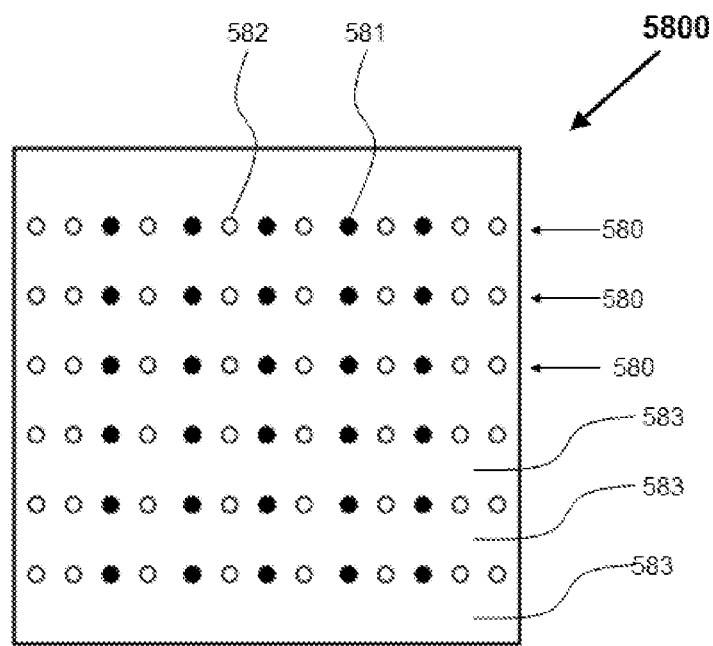
FIG. 18 is a schematic diagram illustrating the cross-sectional view of the hybrid cloth integrated column formed by using the framework and the filling material of one embodiment of the present invention.
Figure 20:
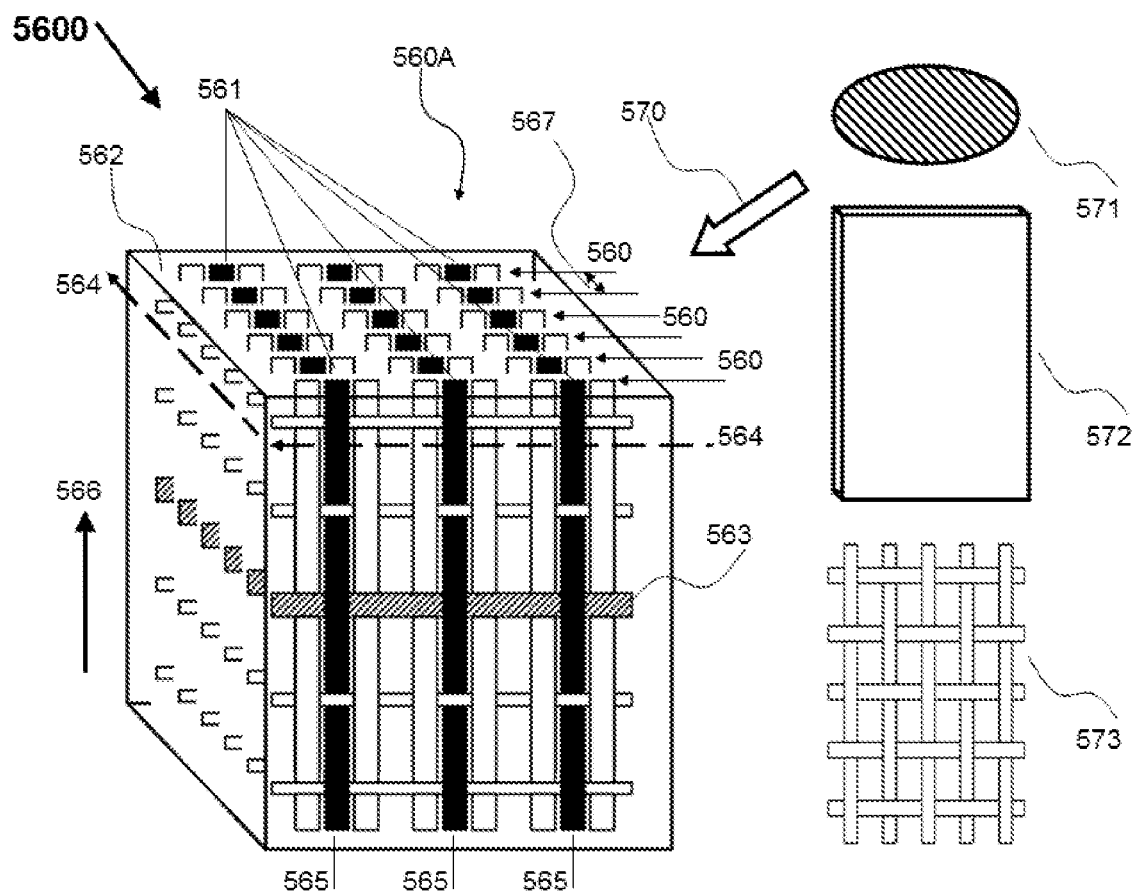
FIG. 20 is a schematic diagram illustrating the features of the hybrid cloth integrated column of the present invention.

As shown in FIG. 20, the hybrid cloth integrated column 5600 of the embodiments of the present invention comprises a column of matrix 562 and a plurality of layers of hybrid cloths 560 packaged in the column of matrix 562, wherein as designated by the numerical symbols 560, 561, 563, 565, 566 and 567, each layer of hybrid cloth 560 contains at least a 2D array of parallel metal wires 565 in the column direction 566, the plurality of layers of hybrid cloths 560 are arranged as a column of layered structure 560A with predetermined pitches 567 among the layers so that the plurality of 2D arrays of parallel metal wires 565 contained in the plurality of layers of hybrid cloths 560 form a 3D array of parallel metal wires 561, giving a plurality of TSV substrates by sawing the hybrid cloth integrated column 5600 into slices along the direction 564 normal to the direction of the 3D array of parallel metal wires 561. Furthermore, as designated by the arrow 570 in FIG. 20, the column of matrix 562 consists of a plurality of supportive plates 572 as shown in FIG. 11 in one embodiment of the present invention; and the column of matrix 562 consists of a plurality of supportive plates 572 and a filling material 571 as shown in FIG. 13 in another embodiment of the present invention, and furthermore, the supportive plates can have various structures, like porous supportive plates or supportive mesh cloths 573 as shown in FIG. 14 or FIG. 15; and finally, the column of matrix 562 consists of a filling material 571 as shown in FIG. 18 in another embodiment of the present invention. Besides, in the embodiments of the present invention, at least one layer of the plurality of layers of hybrid cloths 560 also contains metal wires in the direction normal to the direction of the 2D array of parallel metal wires 565, giving a network of metal wires. As a result, TSV substrates containing a network of metal wires can be produced in the embodiments of the present invention.

It is noted that the length of the hybrid cloth integrated column 5600 in its column direction or the direction of the 3D array of parallel metal wires 561 is not limited to be larger than its length in other directions. The lengths of the hybrid cloth integrated column 5600 in different directions can be flexibly designed according to the efficiency of its production.

Figure 21:
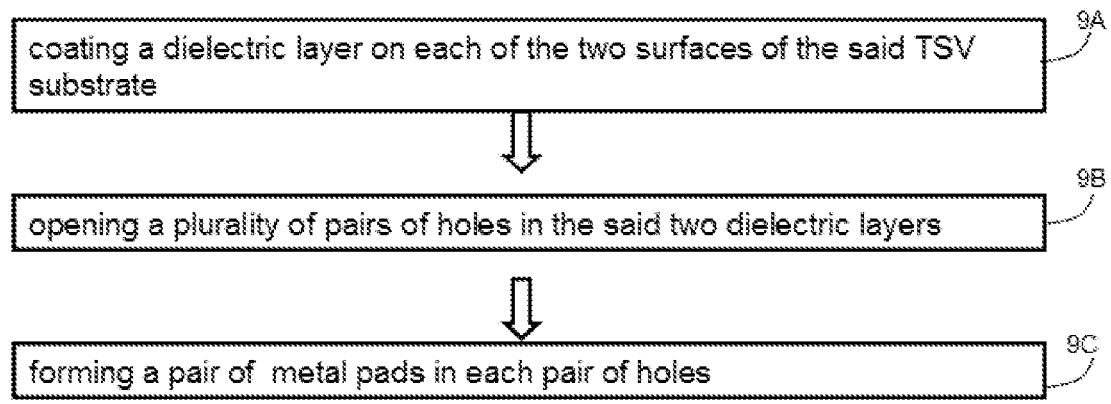
FIG. 21 a flow-process diagram of the method for making a redistributed TSV substrate based on a TSV substrate of one embodiment of the present invention.

FIG. 21 is a flow-process diagram of a method for making a redistributed TSV substrate based on a TSV substrate of one embodiment of the present invention. As shown in FIG. 21, the method includes the processing steps from 9A to 9C, which is illustrated with reference to FIG. 22 in the following.

Figure 22:
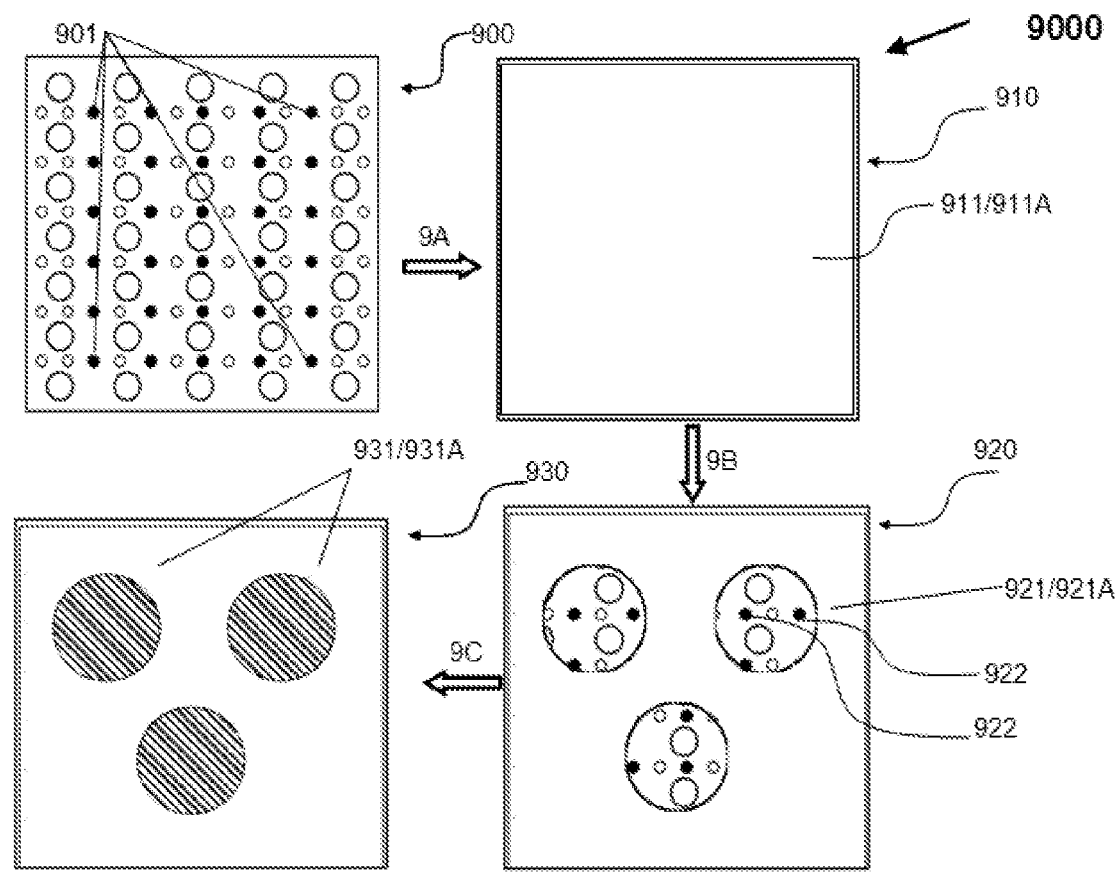
FIG. 22 is a schematic diagram illustrating the method for making a redistributed TSV substrate based on a TSV substrate of one embodiment of the present invention.

As shown in FIG. 22, the numerical symbol 9000 is for illustrating the processing steps 9a to 9C. In the processing step 9A, a dielectric layer is coated onto the upper surface and the lower surface of a TSV substrate, the numerical symbol 900 designates a TSV substrate and 901 designates an array of TSV contained in the TSV substrate 900, 910 designates the TSV substrate coated with the two dielectric layers 911/911A respectively on the upper and lower surfaces of the TSV substrate, and correspondingly called an upper and lower dielectric layer; in the processing step 9B, a plurality of holes 921/921A in the said two dielectric layers are opened, wherein there is at least one TSV 922 exposed in each hole, the holes 921 in the upper dielectric layer 911 align with the holes 921A in the lower dielectric layer 911A, giving a plurality of pairs of holes 921/921A, the two holes in each pair of holes 921/921A are the same in size and shape, the numerical symbol 920 designates the TSV substrate 910 after having the holes 921/921A; in the processing step 9C, a pair of metal pads 931/931A in each pair of holes 921/921A of the TSV substrate 920 are formed, giving an electrically conductive path from one pad 931 to the other pad 931A through the TSV 922 between them, the electrically conductive path is called a redistributed TSV herein so as to produce a substrate 930 with an array of redistributed TSV 931/931A. It is noted that based on the redistributed TSV substrate 930 as shown in FIG. 22, an IC chip packaging substrate can be further produced by conventionally forming one or more layers of electric traces and pads on the upper and lower surfaces of the said redistributed TSV substrate 930.

It is noted that the various parameters for making TSV substrates of the present invention can be flexibly selected to meet the requirement of a specific application for TSV substrates. It is further noted that it is not easy for a macro method based on metal wires to precisely form the plurality of TSV in a TSV substrate due to the dimension change of the matrix material when it is solidified or due to some other imprecise factors of the macro method. However, an array of TSV with precisely determined positions are required in an IC chip packaging application of TSV substrates. So, the method for making the redistributed TSV substrate based on a TSV substrate made from a macro method is disclosed in the embodiment of the present invention, wherein the positions of the redistributed TSV are precisely determined.

Figure 23:
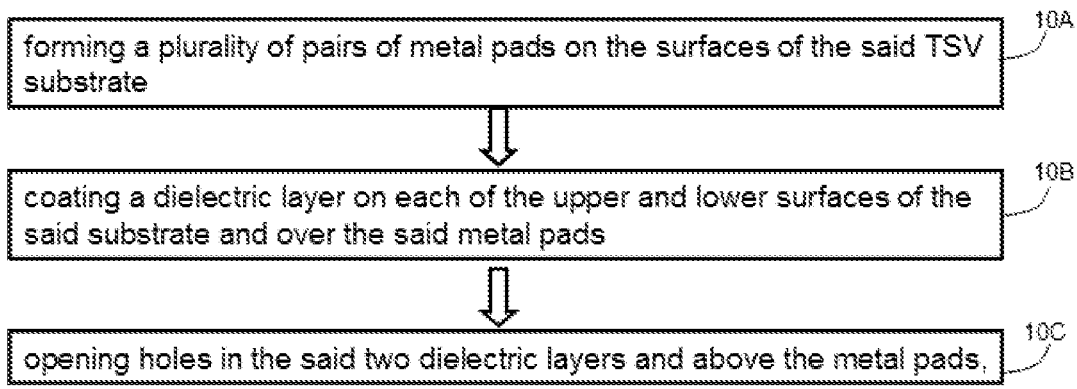
FIG. 23 a flow-process diagram of the method for making a redistributed TSV substrate based on a TSV substrate of another embodiment of the present invention.

FIG. 23 is a flow-process diagram of a method for making a redistributed TSV substrate based on a TSV substrate of another embodiment of the present invention. As shown in FIG. 23, the method includes the processing steps from 10A to 10C, which is illustrated with reference to FIG. 24 in the following.

Figure 24:
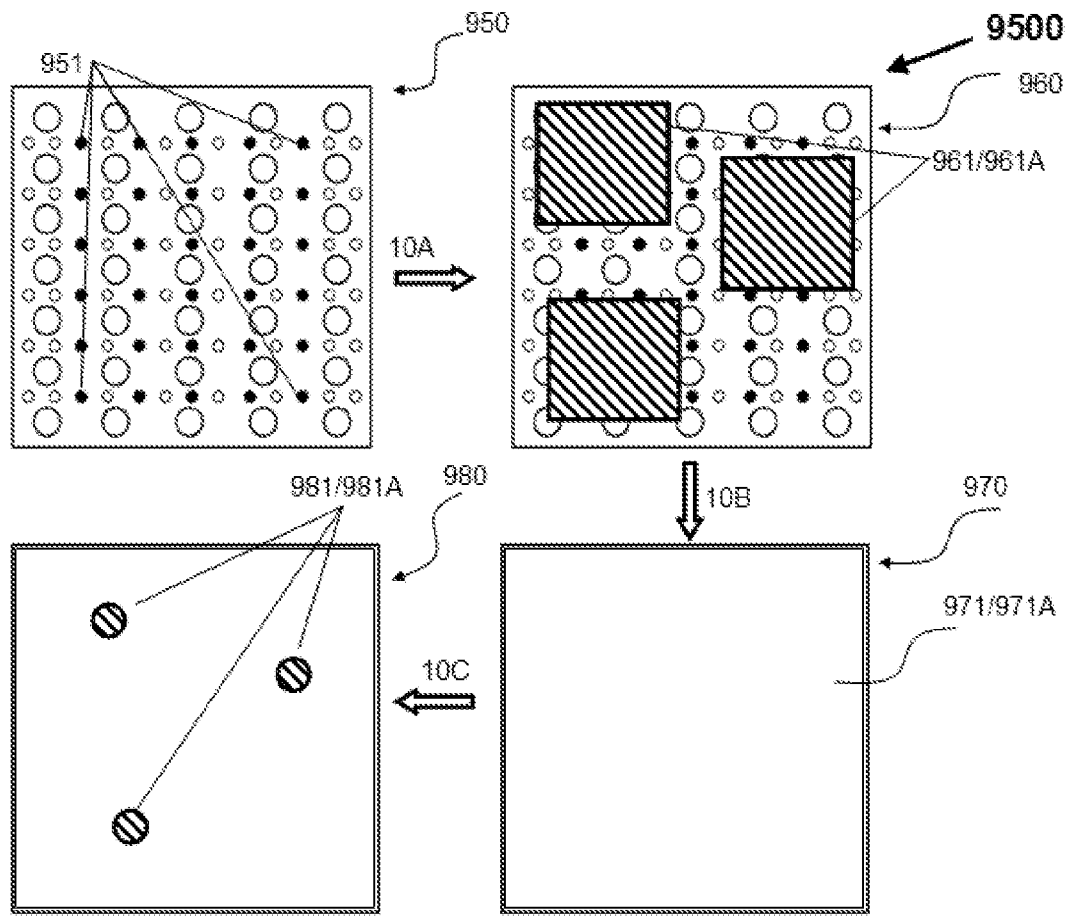
FIG. 24 is a schematic diagram illustrating the method for making a redistributed TSV substrate based on a TSV substrate of another embodiment of the present invention.

As shown in FIG. 24, the numerical symbol 9500 is for illustrating the processing steps 10A to 10C. In the processing step 10A as shown by the arrow 10A, a plurality of pairs of metal pads 961/961A are formed on the upper and lower surfaces of the said substrate 950 containing an array of TSV 951, wherein each metal pad covers at least one TSV, a metal pad 961 on the upper surface of the said substrate 960 corresponds to a metal pad 961A on the lower surface of the said substrate 960, forming a pair of metal pads 961/961A, the two metal pads 961/961A in each pair of metal pads are the same in size and shape, the numerical symbol 960 designates the TSV substrate 950 after having a plurality of pair of metal pieces 961/961A; in the processing step 10B as shown by the arrow 10B, two dielectric layers 971/971A are respectively coated on the upper and lower surfaces of the said substrate 960 and over the said metal pieces 961/961A to form the substrate 970; and in the processing step 10C, a plurality of holes 981/981A in the said two dielectric layers 971/971A and above the metal pieces 961/961A are opened, a portion of each metal piece 981/981A is exposed in each hole, corresponding to each pair of metal pieces 961/961A, an electrically conductive path, called a redistributed TSV is formed from the exposed metal 981 in the hole on the upper surface to the exposed metal 981A in the hole on the lower surface of the said substrate 980 through the TSV between the pair of metal pieces 961/961A so as to produce a substrate 980 with an array of redistributed TSV 981/981A. It is noted that based on the redistributed TSV substrate 980 as shown in FIG. 24, an IC chip packaging substrate can be further produced by conventionally forming one or more layers of electric traces and pads on the upper and lower surfaces of the said redistributed TSV substrate.

It is noted that the various parameters for making TSV substrates of the present invention can be flexibly selected to meet the requirement of a specific application for TSV substrates. It is further noted that it is not easy for a macro method based on metal wires to precisely form the plurality of TSV in a TSV substrate due to the dimension change of the matrix material when it is solidified or due to some other imprecise factors of the macro method. However, an array of TSV with precisely determined positions are required in an IC chip packaging application of TSV substrates. So, the method for making the redistributed TSV substrate based on a TSV substrate made from a macro method is disclosed in one preferred embodiment of the present invention, wherein the positions of the redistributed TSV are precisely determined.

Although the present invention is described in some details for illustrative purpose with reference to the embodiments and drawings, it is apparent that many other modifications and variations may be made without departing from the spirit and scope of the present invention.

What is claimed is:

1. A method for making TSV substrates which are substrates comprising through substrate vias (TSV), comprising, forming a plurality of layers of hybrid cloths by weaving metal wires and supportive wires, wherein at least one 2D array of parallel metal wires is arranged in one direction of the plurality of layers of hybrid cloths;

forming a column of layered structure by integrating a plurality of layers of supportive plates and the plurality of layers of hybrid cloths into a column with all the layers of the column of layered structure extending in a direction of the column layered structure, wherein any two neighboring layers of hybrid cloths are separated by at least one layer of supportive plate, and the plurality of 2D arrays of parallel metal wires contained in the plurality of hybrid cloths are fixed in the column of layered structure and arranged into at least one 3D array of parallel metal wires extending in a direction parallel to the direction of the column of layered structure;

making all the layers in the column of layered structure into a solid entity so as to form a hybrid cloth integrated column from the column of layered structure; and sawing the hybrid cloth integrated column along a direction normal to the direction of the 3D array of parallel metal wires into slices so as to produce a plurality of TSV substrates.

2. The method of claim 1, further comprising the following processing steps, coating a dielectric layer on an upper surface and a lower surface of said TSV substrate, the two dielectric layers on the upper and lower surfaces of the substrate are called an upper dielectric layer and a lower dielectric layer, respectively;

opening a plurality of pairs of holes in said two dielectric layers, wherein there is at least one TSV exposed in each hole, the holes in the upper dielectric layer align with the holes in the lower dielectric layer, thereby opening the plurality of pairs of holes, the two holes in each pair of holes are the same in size and shape;

forming a pair of metal pads in each pair of holes so that an electrically conductive path from one pad to the other pad through the TSV between them is obtained, the electrically conductive path is called a redistributed TSV so as to produce a substrate with an array of redistributed TSV.

3. The method of claim 1, further comprising the following processing steps, forming a plurality of pairs of metal pads on upper and lower surfaces of said TSV substrate, wherein each metal pad covers at least one TSV, a metal pad on the upper surface of said substrate corresponds to a metal pad on the lower surface of said substrate, thereby forming the plurality of pairs of metal pads, the two metal pads in each pair of metal pads are the same in size and shape;

coating a dielectric layer on the upper surface and the lower surface of said substrate and over said metal pads;

opening holes in said two dielectric layers and in the region of the metal pads, a portion of each metal pad is exposed in each hole, corresponding to each pair of metal pads, an electrically conductive path, called a redistributed TSV is obtained from the exposed metal in the hole on the upper surface to the exposed metal in the hole on the lower surface of said substrate through the TSV between the pair of metal pads so as to produce a substrate with an array of redistributed TSV.

4. The method of claim 1, wherein a designed temperature and pressure is applied onto said column of layered structure so that all the layers contained in said column of layered structure are joined together into a solid entity so as to form the hybrid cloth integrated column.

5. The method of claim 1, wherein by filling a filling material into the empty space among all the layers of said column of layered structure and solidifying the filling material, all the layers of said column of layered structure are bonded together into a solid entity so as to form the hybrid cloth integrated column.

6. The method of claim 5, wherein said filling material is also filled into the empty space around said column of layered structure so that said column of layered structure is sealed in said filling material.

7. The method of claim 6, wherein said plurality of layers of hybrid cloths are formed by loosely weaving metal wires and fiberglass wires, said plurality of layers of supportive plates are fiberglass mesh cloth, and said filling material is a paste type of ceramic material.

8. The method of claim 6, wherein said metal wires contained in said plurality of layers of hybrid cloths are metal wires coated with a ceramic or glass coating, and said filling material is a metal material with a low melting point, like aluminum or aluminum alloys.

9. The method of claim 1, wherein said column of layered structure is formed by stacking a plurality of pieces of the supportive plates and a plurality of pieces of the hybrid cloths.

10. The method of claim 1, wherein said column of layered structure is formed by rolling one or more tapes of the supportive plates and one or more tapes of the hybrid cloths.

11. The method of claim 1, wherein said column of layered structure is formed by rolling one or more tapes of the supportive plates and one or more tapes of the hybrid cloths around a column core.

12. The method of claim 1, wherein at least one layer of said plurality of layers of hybrid cloths also contains metal wires in the direction normal to said 2D array of parallel metal wires, thereby forming a network of metal wires.

13. The method of claim 1, wherein said plurality of layers of hybrid cloths are formed by weaving metal wires and fiberglass wires, and said plurality of layers of supportive plates are fiberglass cloth.

14. A method for making TSV substrates which are substrates comprising through substrate vias (TSV), comprising, forming a plurality of layers of hybrid cloths by weaving metal wires and supportive wires, wherein at least one 2D array of parallel metal wires is arranged in one direction of the plurality of layers of hybrid cloth;

forming a column of layered structure by integrating and fixing the plurality of layers of hybrid cloths in a framework with all the layers of the column of layered structure extending in a direction of the column layered structure, wherein the plurality of 2D arrays of parallel metal wires contained in the plurality of hybrid cloths are fixed in the framework and arranged into one 3D array of parallel metal wires extending in a direction parallel to the direction of the column of layered structure;

filling a filling material into an empty space in and around the column of layered structure, solidifying the filling material so that the column of layered structure is sealed in the filling material, thereby forming a hybrid cloth integrated column from the column of layered structure; and sawing the hybrid cloth integrated column along a direction normal to the direction of the 3D array of parallel metal wires into slices so as to produce a plurality of TSV substrates.

15. The method of claim 14, further comprising the following processing steps, coating a dielectric layer on an upper surface and a lower surface of said TSV substrate, the two dielectric layers on the upper and lower surfaces of the substrate are called an upper dielectric layer and a lower dielectric layer, respectively;

opening a plurality of pairs of holes in said two dielectric layers, wherein there is at least one TSV exposed in each hole, the holes in the upper dielectric layer align with the holes in the lower dielectric layer, thereby opening the plurality of pairs of holes, the two holes in each pair of holes are the same in size and shape;

forming a pair of metal pads in each pair of holes so that an electrically conductive path from one pad to the other pad through the TSV between them is obtained, the electrically conductive path is called a redistributed TSV so as to produce a substrate with an array of redistributed TSV.

16. The method of claim 14, further comprising the following processing steps, forming a plurality of pairs of metal pads on upper and lower surfaces of said TSV substrate, wherein each metal pad covers at least one TSV, a metal pad on the upper surface of said substrate corresponds to a metal pad on the lower surface of said substrate, thereby forming the plurality of pairs of metal pads, the two metal pads in each pair of metal pads are the same in size and shape;

coating a dielectric layer on the upper surface and the lower surface of said substrate and over said metal pads;

opening holes in said two dielectric layers and in the region of the metal pads, a portion of each metal pad is exposed in each hole, corresponding to each pair of metal pads, an electrically conductive path, called a redistributed TSV is obtained from the exposed metal in the hole on the upper surface to the exposed metal in the hole on the lower surface of said substrate through the TSV between the pair of metal pads so as to produce a substrate with an array of redistributed TSV.

17. The method of claim 14, wherein said plurality of layers of hybrid cloths are hybrid mesh cloths formed by loosely weaving metal wires and fiberglass wires, and said filling material is a paste or powder type of ceramic or glass material.

18. The method of claim 14, wherein said metal wires contained in said plurality of layers of hybrid cloth are metal wires coated with a ceramic or glass coating, and said filling material is metal material with a low melting point, like aluminum or aluminum alloys.

\* \* \* \* \*